(12) United States Patent
Takizawa et al.

(10) Patent No.: US 7,372,269 B2
(45) Date of Patent: May 13, 2008

(54) MAGNETIC RESONANCE IMAGING METHOD AND APPARATUS

(75) Inventors: Masahiro Takizawa, Chiba (JP); Tetsuhiko Takahashi, Saitama (JP); Yo Taniguchi, Tokyo (JP)

(73) Assignee: Hitachi Medical Corporation, Tokyo (JP)

( * ) Notice: Subject to any disclaimer, the term of this patent is extended or adjusted under 35 U.S.C. 154(b) by 170 days.

(21) Appl. No.: 10/553,900

(22) PCT Filed: Apr. 23, 2004

(86) PCT No.: PCT/JP2004/005928

§ 371 (c)(1),
(2), (4) Date: Oct. 21, 2005

(87) PCT Pub. No.: WO2004/093682

PCT Pub. Date: Nov. 4, 2004

(65) Prior Publication Data

US 2006/0232273 A1    Oct. 19, 2006

(30) Foreign Application Priority Data

Apr. 24, 2003 (JP) ............................. 2003-119403

(51) Int. Cl.
*G01V 3/00* (2006.01)
(52) U.S. Cl. ........................ 324/309; 324/307
(58) Field of Classification Search ............... 324/309, 324/307
See application file for complete search history.

(56) References Cited

U.S. PATENT DOCUMENTS 5,833,609 A    11/1998    Dannels et al.
6,882,148 B2 *  4/2005   Pipe ........................ 324/307
7,023,207 B1 *  4/2006   Gaddipati et al. .......... 324/309
7,102,348 B2 *  9/2006   Zhang et al. .............. 324/309
2003/0058676 A1  3/2003   Kudou et al.

FOREIGN PATENT DOCUMENTS

| JP | 10-155768 | 6/1998 |
|---|---|---|
| JP | 2001-161657 | 6/2001 |
| JP | 2003-315731 | 10/2002 |

OTHER PUBLICATIONS

"The use of Parallel Imaging with Propeller DWI" by J.G. Pipe, Proc. Intl. Soc. Mag. Reson. Med. 11 (2003).*

* cited by examiner

*Primary Examiner*—Louis M. Arana
(74) *Attorney, Agent, or Firm*—Cooper & Dunham, LLP

(57) ABSTRACT

In a magnetic resonance imaging apparatus, an RF pulse is applied to a subject placed in a static magnetic field, a plurality of gradient magnetic fields are applied, and induced nuclear magnetic resonance signal (echo signal) is received by means of a RF receiving coil unit composed of two or more RF receiving coils. A parallel MRI method is applied to echo signals acquired by reducing the echoes per blade of a propeller MRI method so as to remove the artifact to produce a reconstructed image. The reconstructed image is subjected to inverse Fourier transform to return it to the echo signals in a measurement space corresponding to the blade. The echo signals are girded in an arbitrarily predetermined coordinate system for image and combined. Such a processing is conducted for the echo signals of all the blades. A final image is reconstructed using the echo signals after the image creation in the coordinate system for image.

29 Claims, 10 Drawing Sheets

FIG. 3a
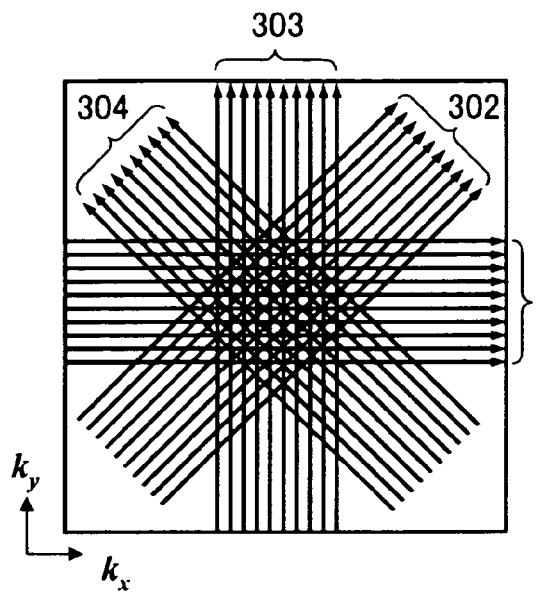
FIG. 3b
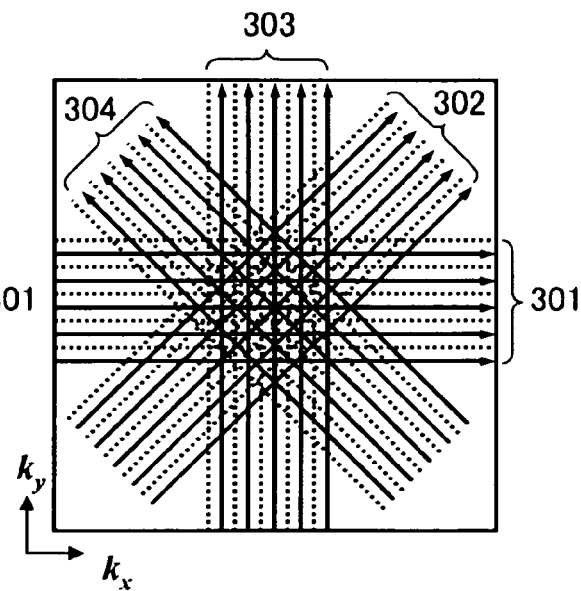
FIG. 3c   FIG. 3d   FIG. 3e   FIG. 3f
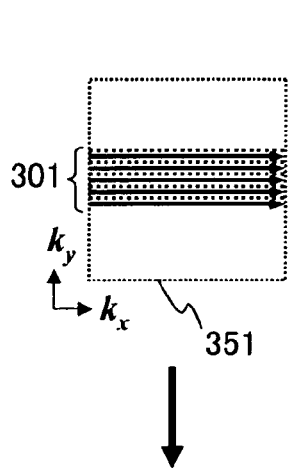 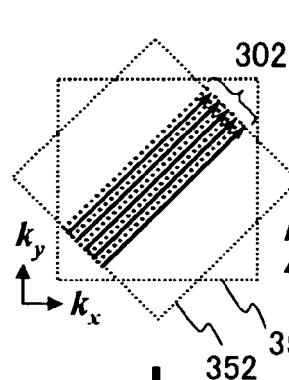 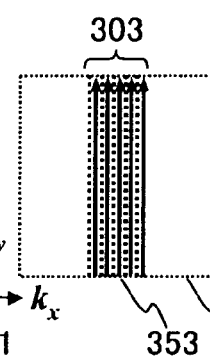 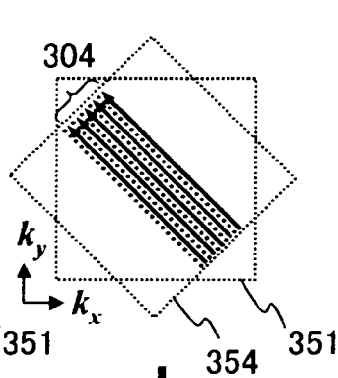
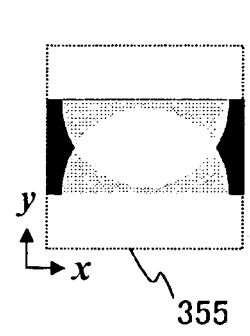 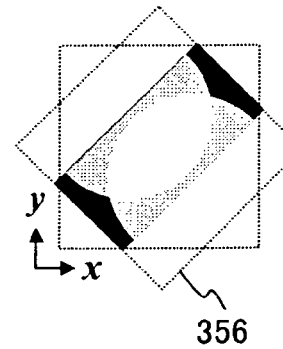 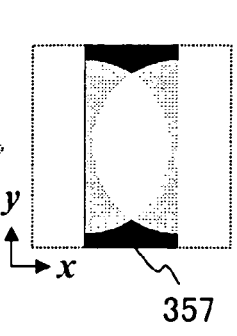 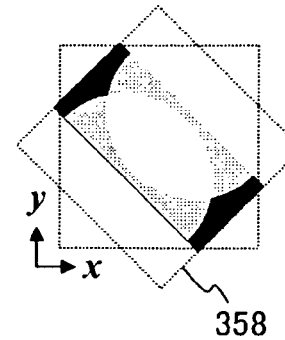

MAGNETIC RESONANCE IMAGING METHOD AND APPARATUS

TECHNICAL FIELD

The present invention relates to a magnetic resonance imaging (hereinafter, abbreviated as MRI) apparatus used to obtain a tomographic image of a region being examined of a subject with the use of a nuclear magnetic resonance (NMR) phenomenon, and more particularly, to a technique for shortening an imaging time and an image reconstruction time by combining the PROPELLER sampling method and the parallel imaging method that uses plural high-frequency receiver coils.

BACKGROUND ART

For an MRI apparatus, the Cartesian sampling method for taking samples along trajectories parallel to the orthogonal coordinate axis of the k-space is often used as a scheme for acquiring echo signals on the k-space needed for image reconstruction. However, a method referred to as non-Cartesian sampling for taking samples along trajectories that are not parallel to the orthogonal coordinate axis of the k-space has been receiving attention in recent years, and one example is the PROPELLER sampling method (reference: Yasushi Watabe et al, "Atarasii Ragiaru Sucan: PROPELLER-hou", *INNERVISION* (17•9) 29-31, 2002)

According to the PROPELLER sampling method, a unit region (hereinafter, referred to as the blade) comprising plural parallel trajectories having the origin of the k-space in between is given as one unit, and echo signals corresponding to almost the entire region of the k-space are measured by rotating blades about the origin of the k-space. Within each blade, plural echo signals are acquired by applying a phase encoding pulse as with normal measurements by the Cartesian sampling method.

Also, the parallel imaging method is used as a technique for shortening an imaging time needed for the MRI apparatus. According to the parallel imaging method, a multiple receiver coil formed by combining plural high-frequency receiver coil units (hereinafter, referred to as RF receiver coils) having local, inhomogeneous sensitivity distributions that differ from coil to coil is used, and echo signals at each RF receiver coil are measured by skipping phase encoding steps. Then, aliasing artifacts occurring on respective reconstructed images are removed using sensitivity distribution data of each RF receiver coil. This can reduce the number of echoes needed to reconstruct a single image, which can in turn shorten an imaging time by reducing the repetition number of times of the pulse sequence.

However, when the parallel imaging method is applied to the PROPELLER sampling method as above, it is necessary to remove aliasing artifacts by applying the generalized aliasing artifact development algorithm to the data of the entire k-space that has been measured by skipping, and this need extends a computation time considerably.

The reference cited above is silent about the application of the parallel imaging method to the PROPELLER sampling method and the problems arising in such a case as discussed above.

DISCLOSURE OF THE INVENTION

The invention therefore has an object to perform fast imaging by shortening an imaging time from the signal measurement to the image display in the PROPELLER sampling method. In particular, the invention has an object to enable fast computation by reducing a computation volume needed for image reconstruction by shortening an imaging time through application of the parallel imaging method.

In order to achieve the above object, the invention is configured as follows in terms of a magnetic resonance imaging method. That is, in a magnetic resonance imaging method, including: an entire image forming step of repetitively performing a unit region processing step including a unit region measuring step of measuring echo signals from a subject corresponding to a unit region having an origin of a k-space and a specific width from a low spatial frequency region to a high spatial frequency region, and a unit region image forming step of forming an image of the unit region from echo signals corresponding to the unit region, while changing an angle of rotation of the unit region about the origin of the k-space, so that an entire image is formed by fusing plural unit region images, measurements of the echo signals are skipped in at least one unit region in the unit region measuring step.

Accordingly, because a measurement time of the unit region in the PROPELLER sampling method can be shortened, it is possible to shorten an overall imaging time, which enables fast imaging.

According to one preferred aspect, in the unit region measuring step, a multiple receiver coil formed by combining plural receiver coil units is used to acquire echo signals at each receiver coil unit, and in the unit region image forming step, the unit region image is formed using the echo signals at each receiver coil unit.

Accordingly, because an imaging time can be shortened even when a unit region image is formed by fusing images reconstructed using echo signals received at the respective receiver coil units, fast imaging is enabled. Moreover, S/N's of the unit region image and the entire image can be enhanced.

Also, according to one preferred aspect, in the unit region image forming step, the unit region image from which aliasing artifacts are removed is formed by using sensitivity distribution data of each receiver coil unit.

Accordingly, by adopting the parallel imaging method, it is possible to remove aliasing artifacts occurring in the unit region image due to skipped-measurements of echo signals with the use of the sensitivity distribution data of each receiver coil unit. As a result, an entire image having no aliasing artifacts can be formed in a short time.

Also, according to one preferred aspect, the unit region is made of plural parallel trajectories, and a measurement of echo signals corresponding to at least one trajectory among the parallel trajectories is skipped in the skipped measurements.

Accordingly, when the unit region image is formed, the need to apply the generalized aliasing artifact development algorithm for removing aliasing artifacts can be eliminated, and aliasing artifacts can be therefore developed within a short time by a fast matrix operation. As a result, a high-quality unit region image having no aliasing artifacts can be formed in a short time.

Also, according to one preferred aspect, measurements of echo signals corresponding to the high spatial frequency region on one side of the unit region are skipped.

Accordingly, by applying a known half Fourier method, it is possible to form a unit region image even when measurements of echo signals corresponding to the high spatial frequency region on one side of the unit region are skipped. A unit region image can be therefore formed in a short time.

In particular, when the parallel imaging method is applied by further performing skipped-measurements in another region of the unit region, a unit region image can be formed in a shorter time.

Also, according to one preferred aspect, the unit region processing step further includes a sensitivity distribution data generating step of generating sensitivity distribution data of each unit region and each receiver coil unit from the echo signals to correspond to the angle of rotation of the unit region and a configuration of the multiple receiver coil, and the sensitivity distribution data generating step is performed before the unit region image forming step.

Accordingly, because echo signals used to find sensitivity distribution data of each receiver coil unit can be acquired simultaneously with measurements of echo signals for image reconstruction, an error between the sensitivity distribution data and a reconstructed image is smaller when the subjects moves during imaging. Aliasing artifacts can be therefore removed in a stable manner.

Also, according to one preferred aspect, in the sensitivity distribution data generating step, the sensitivity distribution data of each unit region and each receiver coil unit is generated independently, using the echo signals at each receiver coil unit in low spatial frequency regions of plural unit regions.

Accordingly, by extracting and synthesizing echo signals of the low spatial frequency regions in plural unit regions, sensitivity distribution data of each unit region and each receiver coil unit can be found. This is because, given that the angle of rotation differs from unit region to unit region, even when skipped-measurements are performed in the respective unit regions, echo signals can be acquired at a sufficiently high density to generate sensitivity distribution data in the low spatial frequency regions, which are the regions where the respective unit regions overlap. This eliminates the need to acquire excessive echo signals for sensitivity distribution data for each receiver coil unit, and a unit region image having no aliasing artifacts can be obtained at high speeds.

Also, according to one preferred aspect, in the unit region measuring step, the echo signals at each receiver coil unit are measured by making intervals between the plural parallel trajectories denser in the low spatial frequency region than intervals in the high spatial frequency region in each of the plural unit regions, and in the sensitivity distribution data generating step, the sensitivity distribution data of each unit region and each receiver coil is generated independently, using the echo signals at each receiver coil unit in the low spatial frequency regions measured densely in the plural unit regions.

Accordingly, by excessively acquiring echo signals in the low spatial frequency regions alone, it is possible to acquire echo signals for data distribution data for each unit region and each receiver coil unit simultaneously with measurements of echo signals for image reconstruction. Hence, sensitivity distribution data of each receiver coil unit can be acquired in responding to body motions of the subject being imaged with a slight extension of the imaging time. In particular, in a case where extracting and synthesizing of echo signals in the low spatial frequency regions in the respective unit regions as described above is not sufficient to find the sensitivity distribution data, by measuring echo signals densely in the low spatial frequency region in one or more unit regions, echo signals for sensitivity distribution data can be acquired at a sufficiently high density to find the sensitivity distribution data.

According to one preferred aspect, in the sensitivity distribution data generating step, echo signals for sensitivity distribution data for each receiver coil unit is generated by synthesizing echo signals at each receiver coil unit in the low spatial frequency regions of the respective unit regions for each receiving coil unit, echo signals for sensitivity distribution data for each unit region and each receiver coil unit are generated independently by converting the echo signals for sensitive distribution data for each receiver coil unit, and sensitivity distribution data of each unit region and each receiver coil unit is generated independently from the thus-generated respective echo signals for sensitivity distribution data for each unit region and each receiver coil unit.

Alternatively, in the sensitivity distribution data generating step, sensitivity distribution data of each unit region and each receiver coil unit is generated independently from echo signals at each receiver coil unit in the low spatial frequency regions in the respective unit regions, sensitivity distribution data of each receiver coil unit is generated by synthesizing the sensitivity distribution data of each unit region and each receiver coil for each receiver coil unit, and sensitivity distribution data of each unit region and each receiver coil unit is generated by converting the sensitivity distribution data of each receiver coil unit.

Alternatively, in the sensitivity distribution data generating step, echo signals for sensitivity distribution data for each receiver coil unit are generated by synthesizing echo signals at each receiver coil unit in the low spatial frequency regions in the respective unit regions for each receiver coil unit, sensitivity distribution data of each receiver coil unit is generated from the echo signals for sensitivity distribution data for each receiver coil unit, and sensitivity distribution data of each unit region and each receiver coil unit is generated by converting the sensitivity distribution data of each receiver coil unit.

Accordingly, because echo signals for sensitivity distribution data for each receiver coil unit are measured in plural unit regions, and simultaneously, sensitivity distribution data of each unit region and each receiver coil unit is generated using the measured echo signals, an S/N of the sensitivity distribution data can be enhanced. It is thus possible to obtain a unit region image from which aliasing artifacts are removed in a short time while enhancing an S/N of the image.

According to one preferred aspect, in the unit region measuring step, the echo signals are measured at each receiver coil unit by making intervals of the plural parallel trajectories in the low spatial frequency region denser than intervals in the high spatial frequency region in one of the unit regions, and in the sensitivity distribution data generating step, for another unit region, sensitivity distribution data of each unit region and each receiver coil is generated using the echo signals at each receiver coil unit in the low spatial frequency region measured densely in the particular one of the unit regions.

Accordingly, by measuring echo signals for sensitivity distribution data excessively in a single unit region alone, sensitivity distribution data of each receiver coil unit can be acquired for another unit region. In other words, when an imaging time is extended slightly by reducing the number of blades needed for acquisition of sensitivity distribution data to one, it is still possible to acquire sensitivity distribution data of each receiver coil unit in response to body motions of the subject being imaged.

Also, according to one preferred aspect, a step of measuring echo signals for sensitivity distribution data for each receiver coil unit in advance is included, and in the sensitivity distribution data generating step, sensitivity distribution data of each unit region and each receiver coil unit is generated using the echo signals for sensitivity distribution data for each receiver coil unit that has been measured in advance.

Accordingly, by measuring echo signals for sensitivity distribution data for each unit region and each receiver coil unit in advance, acquisition of excessive echo signals and computation processing to find sensitivity distribution data of each unit region and each receiver coil can be omitted during measurements of echo signals for image reconstruction. It is thus possible to obtain a unit region image for only an acquisition time of the echo signals for image reconstruction. In particular, this is effective when the subject's body remains motionless during imaging.

Also, according to one preferred aspect, each time the unit region measuring step ends, a unit region image is formed in the unit region image forming step, and the entire image is formed from the unit region image and at least another one unit region image in the entire image forming step.

Accordingly, an entire image can be obtained at a time interval substantially equal to a time needed for a sequence of processing from measurements of echo signals in the unit region to formation of a unit region image. It is thus possible to enhance time resolution of each entire image when the entire images are taken continuously.

Also, according to one preferred aspect, the unit region measuring step and the unit region image forming step are performed in parallel, and in the unit region image forming step, the unit region image is formed using echo signals measured in a unit region measuring step before the current unit region measuring step, while the entire image is formed from the unit region image and at least another one unit region image in the entire image generating step.

Accordingly, measurements of echo signals in the unit region and image reconstruction processing can be performed simultaneously in parallel, which can in turn shorten an overall imaging time.

Also, according to one preferred aspect, the unit region measuring step and the unit region image forming step are performed in parallel, and in the unit region image forming step, the unit region image is formed using echo signals measured in a unit region measuring step before the current unit region measuring step, while in the entire image forming step, after all unit region images including the unit region image are collected, k-space of each unit region is generated by subjecting all the unit region images to inverse Fourier transform, entire k-space data is generated by synthesizing the k-space data of each unit region, and the entire image is formed by subjecting the entire k-space data to Fourier transform, so that the k-space data of each unit region is synthesized by converting the k-space data of each unit region to grid point data on a same coordinate system, and each converted k-space data is added or averaged for each grid point.

Accordingly, it is possible to form an entire image in a short time while finding sensitivity distribution data of each receiver coil unit in response to body motions of the subject being imaged, and fast imaging is therefore enabled.

The object of the invention can be achieved in terms of a magnetic resonance imaging apparatus having the configuration as follows. That is, a magnetic resonance imaging apparatus includes: signal receiving means for receiving echo signals from a subject; measurement control means for measuring the echo signals according to a specific sequence; signal processing means for performing image reconstruction computation using the echo signals; and overall control means for controlling the measurement control means and the signal processing means. The measurement control means is provided with a sequence, according to which a measurement of echo signals corresponding to a unit region formed of plural parallel trajectories on a k-space is repeated by changing an angle of rotation of the unit region about an origin of the k-space. In the magnetic resonance imaging apparatus, the signal processing means includes unit region image forming means for forming a unit region image from echo signals at each unit region, and entire image forming means for forming an entire image from respective unit region images. The signal receiving means includes a multiple receiver coil formed by combining plural receiver coil units to receive the echo signals at each receiver coil unit. The measurement control means measures the echo signals at each receiver coil unit by skipping one or more than one of the parallel trajectories in one ore more than one unit region. The unit region image forming means forms the unit region image from which aliasing artifacts are removed, from the echo signals at each receiver coil unit measured by skipping, and sensitivity distribution data of each unit region and each receiver coil unit.

Also, according to one preferred aspect, the signal processing means further includes sensitivity distribution data generating means for generating sensitivity distribution data of each unit region and each receiver coil unit from the echo signals to correspond to the angle of rotation and a configuration of the multiple receiver coil.

Also, according to one preferred aspect, the overall control means repeats for each unit region, a measurement of echo signals corresponding to the unit region by the measurement control means, formation of the unit region image using the echo signals by the unit region image forming means, and formation of the entire image from the unit region image and another unit region image by the entire image forming means.

Also, according to one preferred aspect, the overall control means repeats, in parallel, a measurement of echo signals corresponding to the unit region by the measurement control means, and the unit region image formation using echo signals acquired by a measurement of a unit region before the measurement of the current unit region by the unit region image forming means, and forms the entire image in the entire image forming means each time the unit region image and at least another one region image are collected.

Advantages of these aspects are the same as the advantages of the corresponding methods described above.

BRIEF DESCRIPTION OF THE DRAWINGS

FIG. 3 is a view showing data mapping on k-spaces of respective blades in the first embodiment of the invention, FIG. 3a being a view when data acquired by the normal PROPELLER MRI method is mapped on a k-space, FIG. 3b being a view when data acquired by performing skipped-measurements on FIG. 3a is mapped on the k-space, and FIG. 3c through FIG. 3f being views showing aliasing images obtained by reconstructing data of FIG. 3b that is divided and mapped for each blade;

BEST MODE FOR CARRYING OUT THE INVENTION

Figure 4:
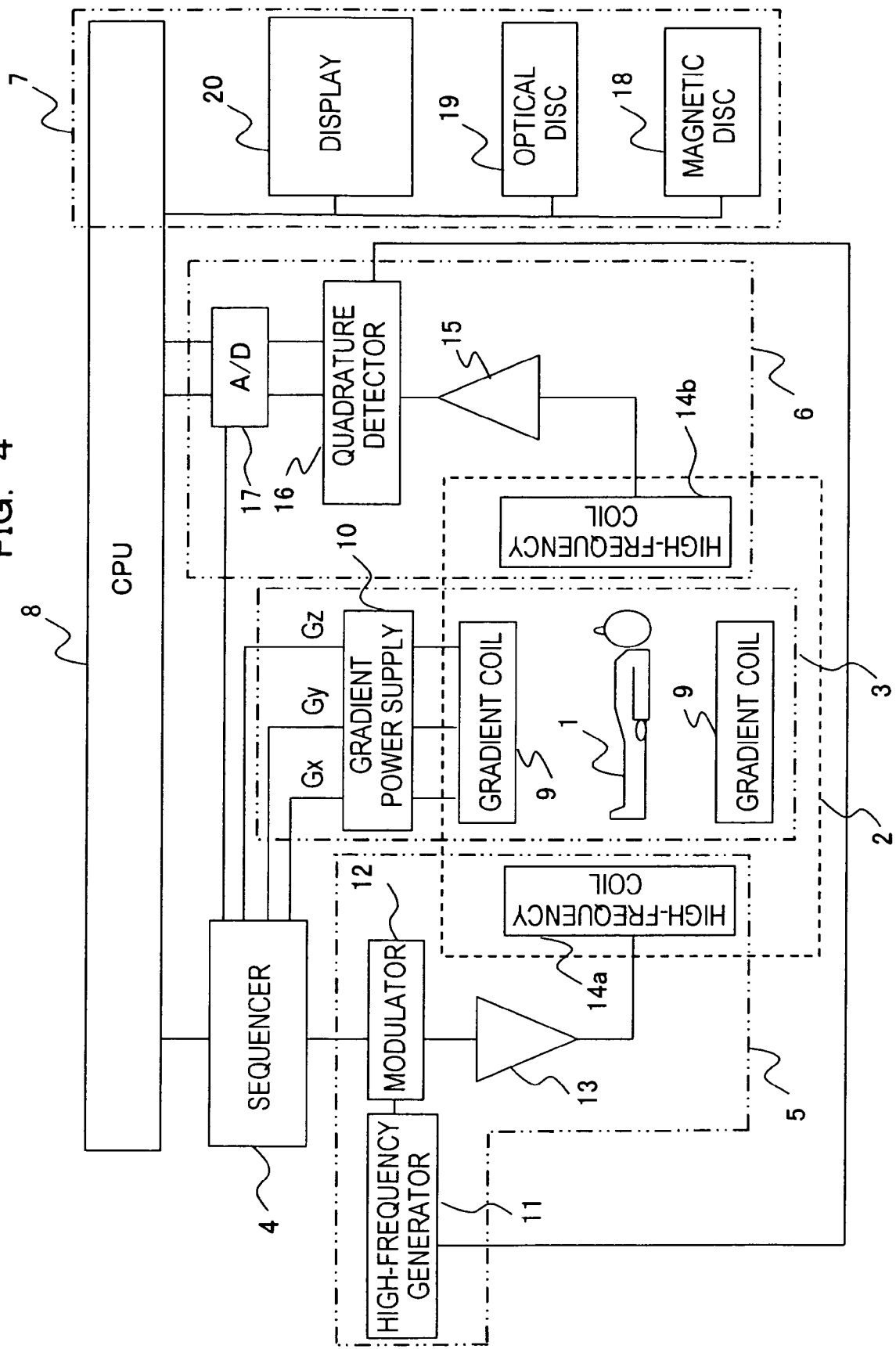
FIG. 4 is a view showing the overall configuration of an MRI apparatus to which the invention is applied.

FIG. 4 is a block diagram showing the overall configuration of a magnetic resonance imaging apparatus of the invention. The magnetic resonance imaging apparatus is used to obtain a tomographic image of a subject using the nuclear magnetic resonance (NMR) phenomenon, and as is shown in FIG. 4, it comprises a static magnetic field generating system 2, a gradient magnetic field generating system 3, a transmitter system 5, a receiver system 6, a signal processing system 7, a sequencer 4, and a central processing unit (CPU) 8.

The static magnetic field generating system 2 generates a homogeneous static magnetic field in a space surrounding a subject 1 in a direction orthogonal to the body axial direction or the body axis, and magnetic field generating means of the permanent magnet method, the normal conduction method, or the superconduction method is provided around the subject 1.

The gradient magnetic field generating system 3 comprises gradient coils 9 wound around in three axial directions, X, Y, and Z, and gradient power supplies 10 that drive respective gradient coils. It assigns one of a slicing gradient pulse (Gs), a phase encoding gradient pulse (Gp), and a frequency encoding gradient pulse (Gr) to each of the X-, Y-, and Z-axis directions, and applies these pulses to the subject 1 by driving the gradient power supplies 10 for the respective coils according an instruction from the sequencer 4 described below. To be more concrete, a slice plane is set with respect to the subject 1 by applying Gs to one of the X, Y, and Z directions, and Gp and Gr are applied to the remaining two directions to encode position information of the respective directions in echo signals. Alternatively, when a slice plane is oblique, the three gradient magnetic fields are distributed to the respective axial directions depending on the oblique angle, and a sum of the gradient magnetic fields in each axial direction is applied in the corresponding axial direction.

The sequencer 4 is control means for repetitively applying a high-frequency magnetic field pulse (hereinafter, referred to as the RF pulse) and the gradient pulses according to a specific pulse sequence. It operates under the control of the CPU 8, and sends various instructions needed to acquire data of a tomographic image of the subject 1 to the transmitter system 5, the gradient magnetic field generating system 3, and the receiver system 6.

The transmitter system 5 irradiates the RF pulse that gives rise to nuclear magnetic resonance of atomic nucleus spins of atoms forming biologic tissues of the subject 1, and it comprises a high-frequency oscillator 11, a modulator 12, a high-frequency amplifier 13, and a high-frequency coil 14a at the transmitter's end. A high-frequency pulse outputted from the high-frequency oscillator 11 is amplitude-modulated by the modulator 12 at timing instructed by the sequencer 4, and the amplitude-modulated high-frequency pulse is amplified by the high-frequency amplifier 13, after which the amplified pulse is fed to the high-frequency coil 14a provided in close proximity to the subject 1. An electromagnetic wave (RF pulse) is thus irradiated to the subject 1.

The receiver system 6 detects an echo signal (NMR signal) released as a result of nuclear magnetic resonance (NMR) of atomic nucleus spins of atoms forming biologic tissues of the subject 1, and it comprises a high-frequency coil 14b at the receiver's end, an amplifier 15, a quadrature detector 16, and an analog-to-digital converter 17. A responding electromagnetic wave (NMR signal) from the subject 1 that is induced by an electromagnetic wave irradiated from the high-frequency coil 14a at the transmitter's end is detected by the high-frequency coil 14b provided in close proximity to the subject 1. After the detected wave is amplified by the amplifier 15, it is divided to orthogonal signals in two systems by the quadrature detector 16 at timing instructed by the sequencer 4. Each signal is then converted to a digital quantity by the analog-to-digital converter 17, and sent to the signal processing system 7.

The signal processing system 7 includes an external storage device, such as a magnetic disc 18 and an optical disc 19, and a display 20 comprising a CRT or the like. When data from the receiver system 6 is inputted into the CPU 8, the CPU 8 executes processing, such as signal processing and image reconstruction, and a resultant tomographic image of the subject 1 is displayed on the display 20 and recorded in the magnetic disc 18 or the like in the external storage device.

Referring to FIG. 4, the high-frequency coils 14a and 14b, respectively, at the transmitter's end and the receiver's end and the gradient coils 9 are provided within a static magnetic space of the static magnetic generating system 2 provided in a space surrounding the subject 1.

Regarding spin seeds to be imaged by the MRI apparatus as described above, protons that are principal structure materials of a subject are commonly used in practical clinic. By turning a spatial distribution of the proton density and a spatial distribution of a relaxation phenomenon of excitation into images, the structures or the functions of the head, the abdomen, the limbs, etc. of a human body are imaged two-dimensionally or three-dimensionally.

Figure 5:
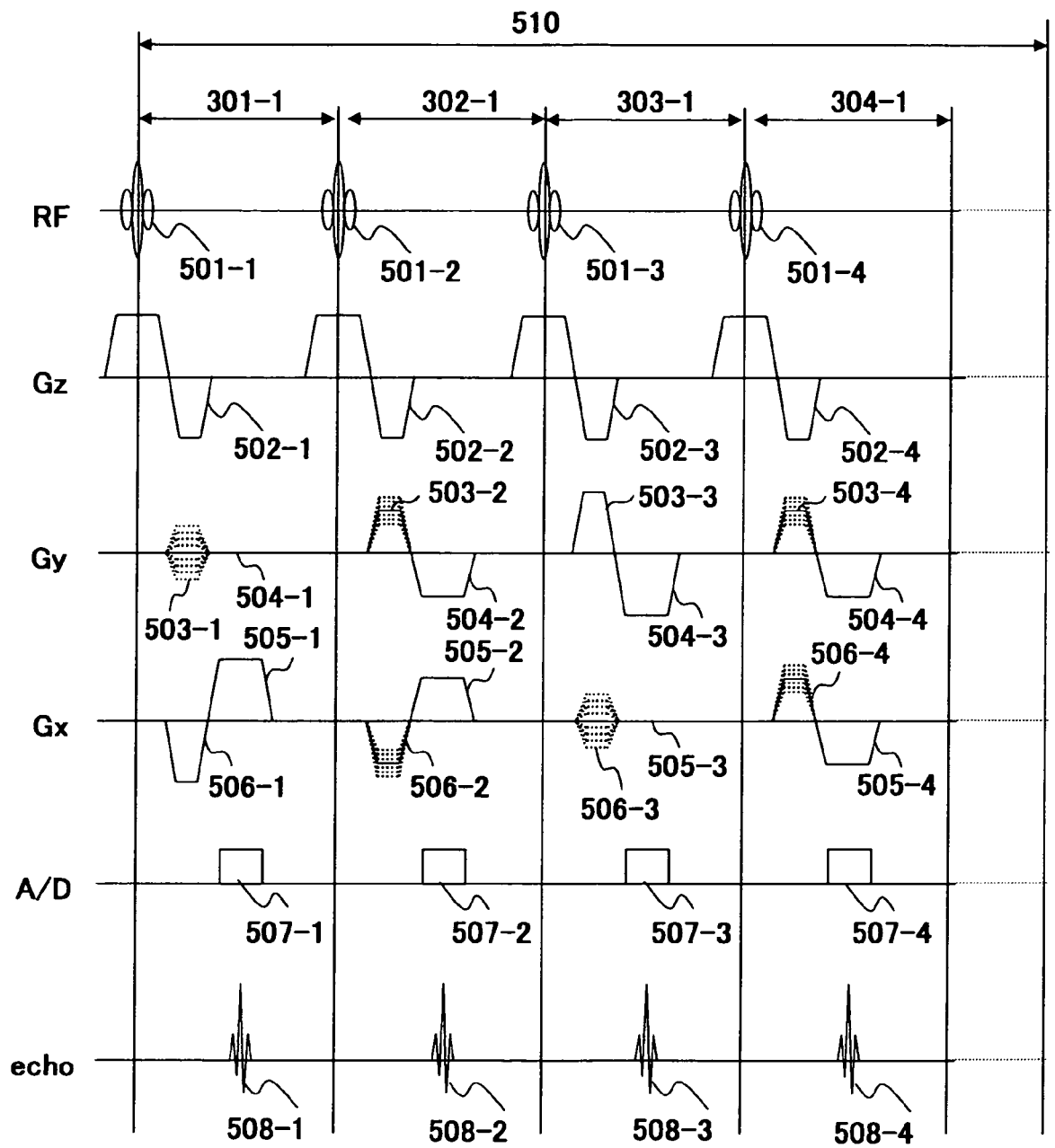
FIG. 5 is a view showing a pulse sequence of the PROPELLER MRI method to which the invention is applied.

The PROPELLER sampling (hereinafter, referred to as the PROPELLER MRI) method (reference: James G. Pipe, "Motion Correction with PROPELLER MRI: Application to Head Motion and Free Breathing Cardiac Imaging", *Magnetic Resonance in Medicine* 42:963-969, 1999) will now be described. FIG. 5 shows one example of a gradient echo pulse sequence using the PROPELLER MRI method. Gradient magnetic field outputs are set so that each blade has a different angle of rotation with respect to the kx axis of the k-space. In addition, within each blade, echo signals each having a different phase encode by application of the phase encoding gradient pulse are measured in the matching number with parallel trajectories. FIG. 5 shows a case where measurement on the k-space is divided to four blades 301 through 304, and five echo signals are acquired within each blade. The blades 301 through 304 have angles of rotation, 0°, 45°, 90°, and 135°, respectively, with respect to the kx axis.

Referring to FIG. 5, RF, Gz, Gy, Gx, A/D, and echo denote an RF pulse, gradient magnetic fields in the respective Z-, Y-, and X-axis directions, analog-to-digital conversion, and an echo signal, respectively. Referring to FIG. 5, in particular, the Z direction is defined as the slice direction. Numeral 501 denotes an RF pulse, numeral 502 denotes a slicing gradient pulse (Gs), numeral 503 denotes a phase encoding gradient pulse (Gp), numeral 505 denotes a frequency encoding gradient pulse (Gr), numeral 506 denotes a dephasing gradient pulse, numeral 507 denotes a sampling window, numeral 508 denotes an echo signal, and numerals 301 through 304 denote repetition times (time intervals between 501's).

It should be noted, however, that the phase encoding gradient pulse 503, the frequency encoding gradient pulse 505, and the dephasing gradient pulse 506 are independently dispersed in the X-axis direction and the Y-axis direction depending on the angle of rotation of the blade. As a result, in the Y-axis direction gradient magnetic field (Gy), a component 504 of the frequency encoding gradient pulse 505 is generated and a component of the dephasing gradient pulse 506 is added to the phase encoding gradient pulse 503. Also, in the X direction gradient magnetic field (Gx), a component of the phase encoding gradient pulse 503 is added to the dephasing gradient pulse 506.

For example, because the blade 301 of FIG. 5 has 0° (that is, being parallel) with respect to the kx axis, the phase encoding gradient pulse 503, the frequency encoding gradient pulse 505, and the dephasing gradient pulse 506 are not dispersed, and gradient magnetic fields of specific amplitudes are applied in their respective axes. However, in the blades 302 through 304 having an angle other than 0° with respect to the kx axis, the phase encoding gradient pulse 503, the frequency encoding gradient pulse 505, and the dephasing gradient pulse 506, each having a specific amplitude in the blade 301, are dispersed independently in the X-axis direction and the Y-axis direction and then applied, and the waveform of the gradient pulses in the X- and Y-axis directions therefore form a complex shape by addition of dispersed components in the respective directions.

In addition, in the MRI apparatus, a quantity of application (=an area enclosed by the gradient pulse waveform and the time axis) of the phase encoding gradient pulse 503 is changed for each repetition time of the pulse sequence, and a different phase encode is given to an echo signal. Echo signals 508 obtained in their respective phase encodes are thus detected. This operation is repeated as many times as the number of the phase encodes until echo signals needed to reconstruct a single image are obtained within an image acquisition time 510.

According to the Cartesian sampling method, values, such as 64, 128, 256, and 512, are selected as the number of the phase encodes for a single image, and each echo signal is normally detected in the form of time sequential data comprising 128, 256, 512, or 1024 sets of sampled data. A single MR image is formed by subjecting these data sets to two-dimensional Fourier transform.

Meanwhile, according to the PROPELLER MRI method, the number of echoes (the number of parallel trajectories) per blade and the number of blades can be set, for example, in accordance with Equation (1):

$$\text{(the number of echoes per blade)} \times \text{(the number of blades)} = \text{(the number of matrices)} \times (\pi/2) \quad (1)$$

For example, given the number of echoes per blade=32 and the number of matrices=256, then the number of blades=about 8 to 10.

Figure 6A:
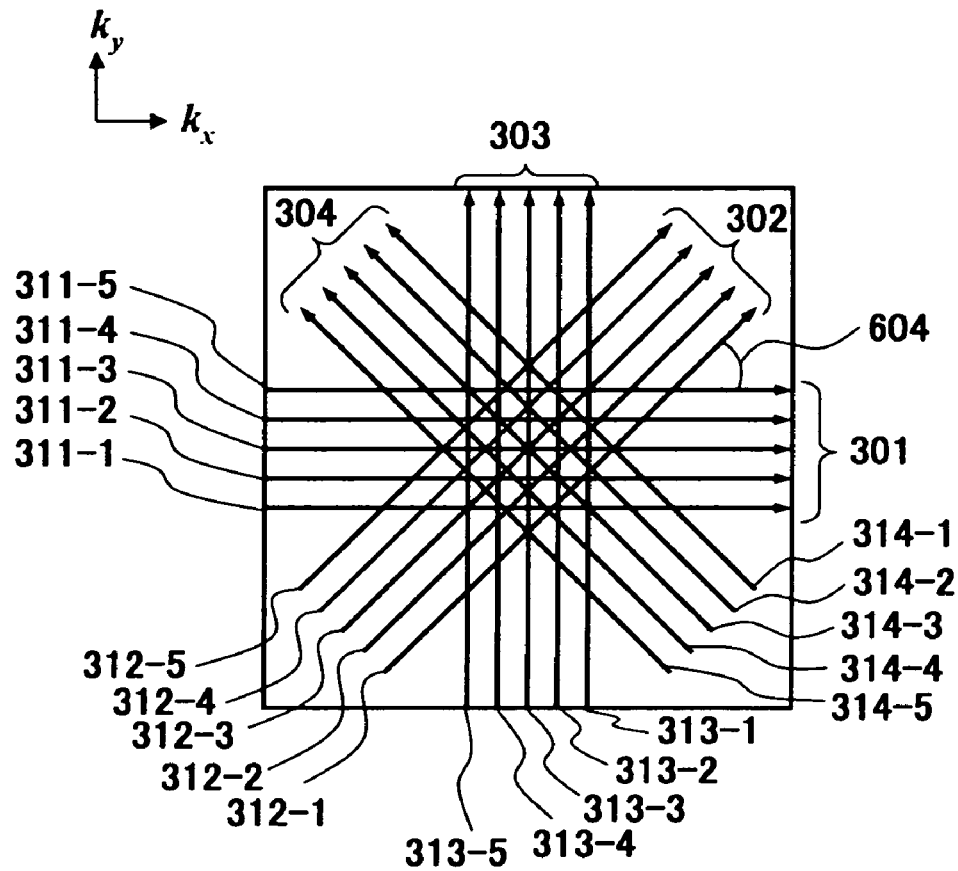
FIG. 6 is a view showing the PROPELLER MRI method and gridding, FIG. 6a being a view showing mapping of data acquired by the PROPELLER MRI method on the k-space, and FIG. 6b being a view showing a relation between mapping of actually measured data (white circles) and placement of grid points of the k-space.

FIG. 6a shows a result when echo signals sampled using the pulse sequence of FIG. 5 are placed in the k-space. Referring to FIG. 6a, the respective blades 301 through 304 are rotated by an angle of rotation, 604, about the origin of the k-space, and five echo signals each having a different phase encode are acquired within each blade. In other words, echo signals 311-1 through 311-5 are acquired in the blade 301, echo signals 312-1 through 312-5 are acquired in the blade 302, echo signals 313-1 through 313-5 are acquired in the blade 303, and echo signals 314-1 through 314-5 are acquired in the blade 304. The sequence of suffixes of the echo signals corresponds to the time sequence along which the echo signals are acquired. In other words, the smaller the suffix number, the earlier the echo signal was obtained, and the larger the suffix number, the later the echo signal was obtained (hereinafter, the same applies unless specified otherwise).

Figure 6B:
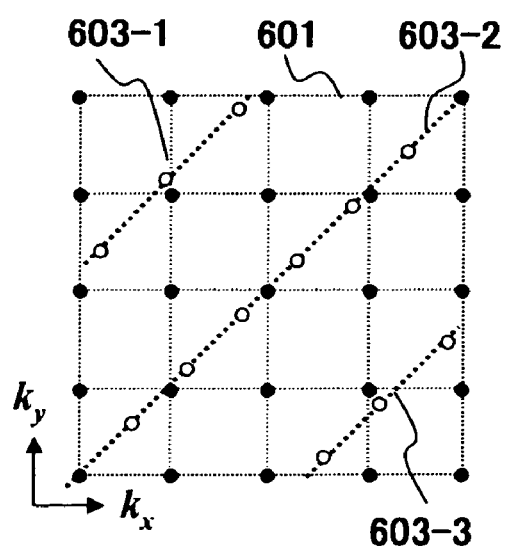

The mapping of data to the k-space 601 will now be described. FIG. 6b is a schematic view when data acquired by the PROPELLER MRI method is subjected to gridding processing and re-mapped on grid points of the k-space. The k-space 601 has coordinates in the form of regular grid points as are indicated by black circles in FIG. 6b. However, because data acquired by the PROPELLER MRI method pass through different trajectories (coordinates) with respect to the k-space as data 603-1 through 603-3, sampled data indicated by white circles does not coincide with the grid point coordinates (black circles in FIG. 6b) of the k-space. In the gridding processing, sampled data (white circles in FIG. 6b) is re-mapped on the regular grid point coordinates (black circles in FIG. 6b) by interpolation processing. In other words, data that is not present on the grid point coordinates of the k-space is converted to data on the grid point coordinates by finding data on the grid point coordinates from sampled data that is not present on the grid point coordinates of the k-space by interpolation processing. The gridding processing can be performed, for example, using an interpolation function, such as a Sinc function and a Kaiser-Bessel function (reference: J. I. Jackson et al., "Selection of a Convolution Function for Fourier Inversion Using Gridding", *IEEE Trans. Med. Imaging*, vol. 10, pp. 473-478, 1991).

Figure 7A:
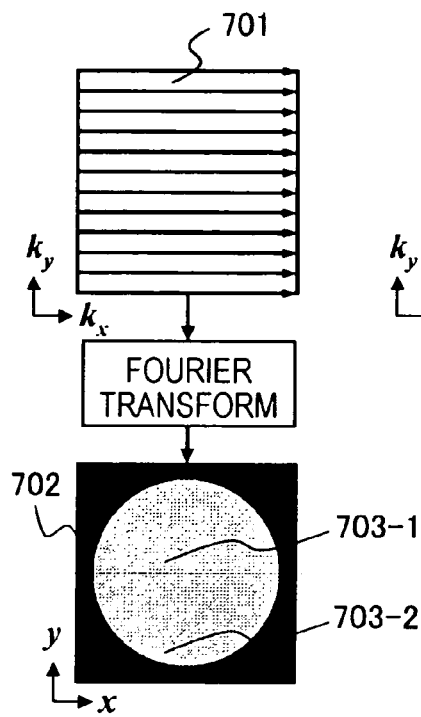
FIG. 7 is a view showing the parallel MRI method.
Figure 7B:
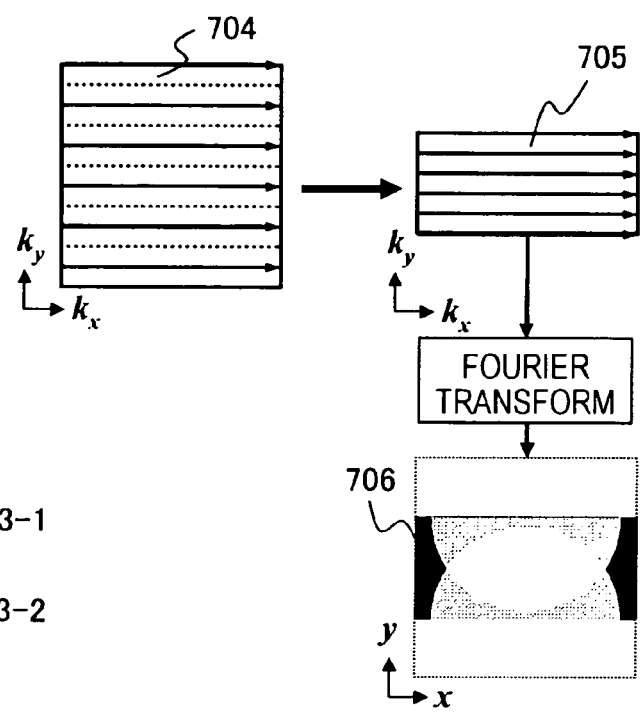

The parallel imaging (hereinafter, referred to as parallel MRI) method (reference: J. B. Ra, C. Y. Rim, "Fast Imaging Using Subencoding Data Sets from Multiple Detectors", *Magnetic Resonance in Medicine* 30: 142-145, 1993) will now be described. FIG. 7a shows a case where echo signals acquired by executing a pulse sequence of the Cartesian sampling method (for example, the gradient echo method) are placed in a k-space 701. Numeral 702 is an image reconstructed by subjecting data of the k-space 701 to Fourier transform. In contrast, FIG. 7b shows a case where only half the echo signals are acquired by executing the pulse sequence by doubling the steps of the phase encode being applied (that is, skipping half the number of all the phase encodes). In this case, echo signals are placed in the k-space 704 alternately in parallel with the kx axis (solid lines within 704 represent measured echo signals, and dotted lines represent echo signals that were not measured) In this case, because acquired echo signals are placed alternately, numeral 705 is the k-space that is reduced to half in size by using the lines of acquired echo signals alone, and numeral 706 is a reconstructed image by subjecting data of the reduced k-pace 705 to Fourier transform.

In this case, because the reconstruction matrices are reduced to half while maintaining the spatial resolution at the time of imaging, aliasing artifacts occur on the image 706. The aliasing artifacts can be considered as being the same as an image formed by superimposing an upper portion 703-1 and a lower portion 703-2 of a region partitioned by a dotted line in the image 702 of FIG. 7a when all the echo signals are acquired. In the MRI apparatus, when measurements are performed by reducing the number of echoes to be acquired as has been described, aliasing artifacts corresponding to the skipped steps are known to occur in a resultant image. Hereinafter, an image in which aliasing artifacts have occurred is referred to as an aliasing image.

Figure 7C:
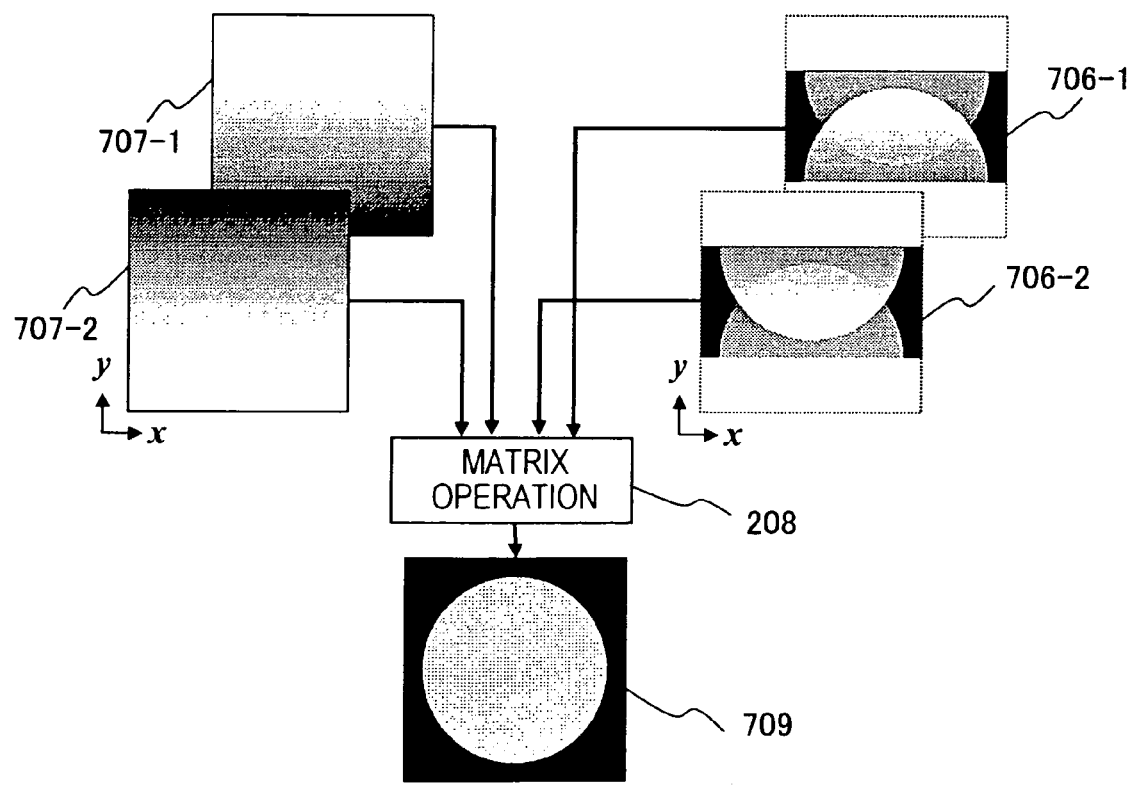

The aliasing image is removed by the parallel MRI method. That is to say, according to the parallel MRI method, echo signals at each RF receiver coil are measured using a multiple receiver coil comprising plural RF receiver coils, and the aliasing image is developed using sensitivity distribution data of each RF receiver coil. FIG. 7c shows one example of the signal processing by the parallel MRI method when two RF receiver coils are used. According to the parallel MRI method, aliasing images 706-1 and 706-2 are obtained at the respective RF receiver coils, and an image 709 having no aliasing artifacts is obtained by performing a matrix operation 208 using the sensitivity distribution data 707-1 and 707-2 of the respective RF receiver coils. The suffixes of the sensitivity distribution data 707 and the aliasing image 706 represent the RF receiver coil numbers. In order to perform the parallel MRI method in a stable manner, the sensitivity distribution of each RF receiver coil used (the y direction in FIG. 7) needs to be different from a direction (the phase encoding direction) in which the aliasing artifacts occurred.

In general, the sensitivity distribution data 707-1 and 707-2 of the respective RF receiver coils is generated by executing an exclusive pulse sequence prior to the pulse sequence for obtaining an image. Alternatively, the phase encoding steps when measuring low spatial frequency regions of the k-space may be made denser with the use of the pulse sequence for obtaining an image to generate echo signals in the low spatial frequency regions (a case when applied to the PROPELLER MRI method of the invention will be described below). In general, because the sensitivity distribution of an RF receiver coil undergoes spatial fluctuation gently, echo signal data in the low spatial frequency regions alone is sufficient. Rather, this is preferable because an S/N ratio of the sensitivity distribution data can be enhanced by preventing the mixing of noises that occurs when data of the high spatial frequency regions are also considered. In this case, however, the number of echo signals acquired by the pulse sequence for obtaining an image is increased in comparison with a case where the exclusive sequence pulse is used, which extends an imaging time proportionately. Conversely, when the sensitivity distribution data is found in advance, because blade images and an entire image can be obtained for only an acquisition time of image reconstruction echo signals, an imaging time can be shorter. The method of finding the sensitivity distribution data in advance is effective when the subject's body remains motionless during the imaging.

First Embodiment

On the basis of the principles of the PROPELLER MRI method and the parallel MRI method as above, a first embodiment of the invention will now be described with reference to FIG. 1 and FIG. 3.

For ease of description, the PROPELLER MRI method in a case where measurements are performed using four blades will be described. FIG. 3a shows the PROPELLER MRI method in a normal case where ten echo signals are acquired within each of four blades 301 through 304. In contrast, FIG. 3b shows a case where only half (five) the echo signals are acquired by setting the intensity of the phase encoding gradient magnetic field to be applied within each blade twice as high as that of FIG. 3a. Solid lines in the drawing represent echo signals that will be measured, and dotted lines represent positions of echo signals that will not be measured.

When measurements are performed in this manner, aliasing artifacts occur in an image. However, because an angle of the k-space differs from blade to blade in the PROPELLER MRI method, the aliasing artifacts will not form a simple shape as in FIG. 7b. For this reason, in the invention, the respective blades 301 through 304 are extracted separately, and the k-space divided as in FIG. 3c through FIG. 3f is considered. Data of the echo signals acquired by the PROPELLER MRI method is generally re-mapped (subjected to gridding processing) on a single, common k-space, which is the final coordinate system for image reconstruction (351 in FIG. 3; hereinafter, such a k-space coordinate system is referred to as the image coordinate system).

In this invention, the gridding processing is not performed, and data is subjected to Fourier transform intact in the form of the coordinate systems 351 through 354 that differ from blade to blade (351 and 353 as well as 352 and 354 in FIG. 3 are shifted from each other by 90°). Aliasing images 355 through 358 are thus reconstructed on their respective coordinate systems. These images are of the shape rotated with respect to the final image coordinate system (355 in FIG. 3) as in the same relation with the k-spaces 351 through 354. By reconstructing data of the respective blades using different coordinate systems in this manner, the aliasing images 355 through 358 of the respective blades are obtained without performing the gridding processing.

Figure 1:
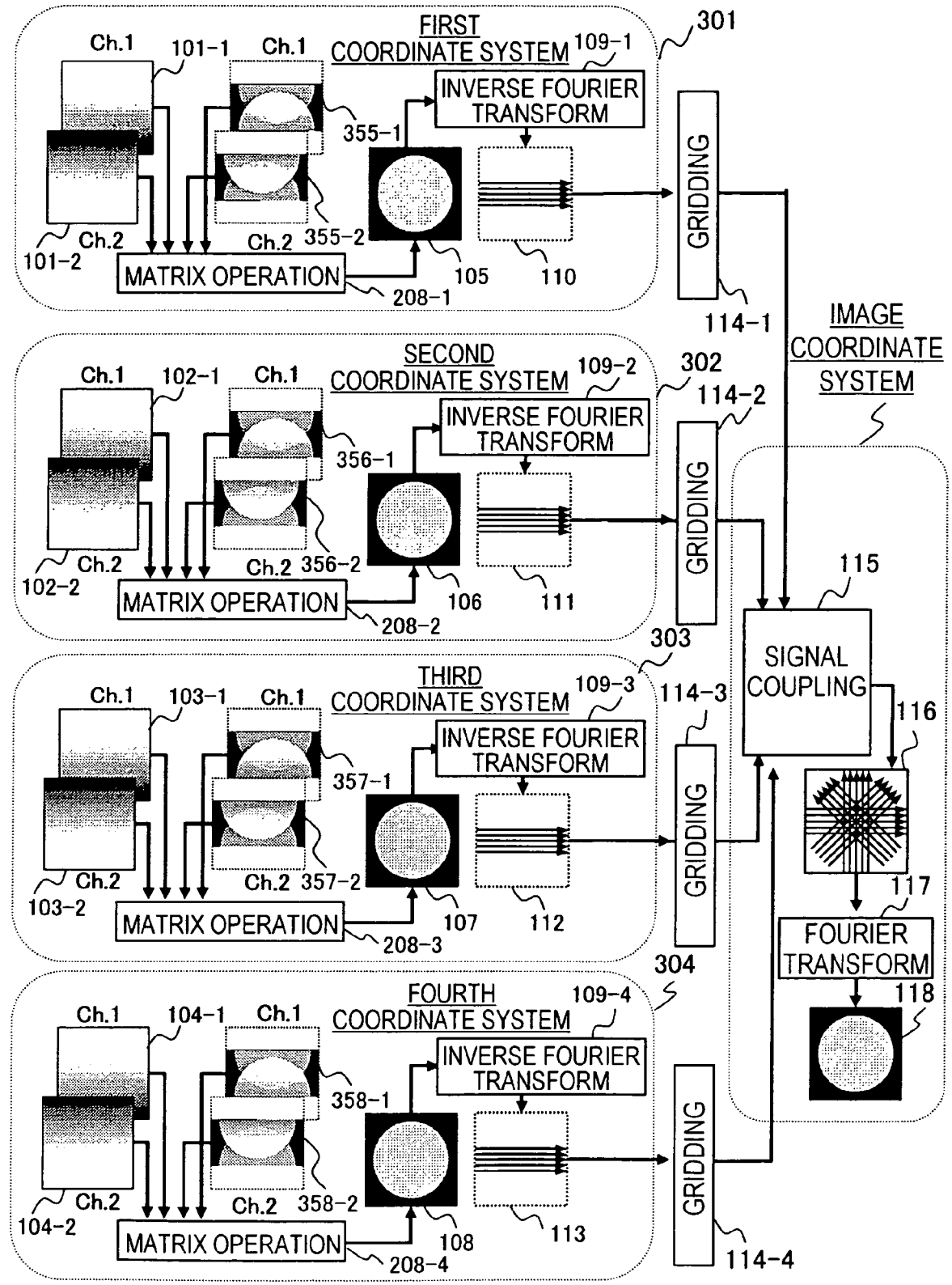
FIG. 1 is a view showing in detail signal processing in a first embodiment of the invention.

FIG. 1 shows reconstruction processing of the divided aliasing images 355 through 358. As in FIG. 7c, FIG. 1 shows the processing in a case where imaging is performed using two RF receiver coils, and suffixes of the sensitivity distribution data 101 through 104 of the RF receiver coils and the aliasing images 355 through 358 denote the RF receiver coil numbers. Herein, an image 105 having no aliasing artifacts is obtained by applying a matrix operation processing 208-1 to the aliasing images 355-1 and 355-2 obtained in 301, using the sensitivity distribution data 101-1 and 101-2 of the respective RF receiver coils in a first coordinate system obtained depending on an angle of rotation of the first blade 301. Subsequently, k-space data 110 on the first coordinate system is obtained, on which reconstruction by the parallel MRI method has been performed through inverse Fourier transform 109-1.

Likewise, for the aliasing images 356 through 358 obtained in the other blades 302 through 304, images 106 through 108 having no aliasing artifacts are obtained by applying matrix operation processing 208-2 through 208-4 to the sensitivity distribution data 102 through 104 of the RF receiver coils corresponding to the coordinate systems of the respective blades, after which inverse Fourier transforms 109-2 through 109-4 are performed. K-space data 111 through 113 on the coordinate systems of the respective blades is thus generated.

The k-space data 110 through 113 correspond, respectively, to the coordinate systems 351 through 354, and form therefore coordinate systems that differ from one another.

The k-space data 110 through 113 on the respective coordinate systems thus generated is subjected to the gridding processing 114-1 through 114-4, and re-mapped on the final image coordinate system (in FIG. 1, it is the same as the first coordinate system 351; however, they are not necessarily the same) 116, and synthesized (by processing, for example, addition or averaging for each grid point) on the image coordinate system 116 by signal coupling processing 115. A final image 118 is obtained by subjecting the k-space data synthesized on the imaging coordinate system 116 to Fourier transform 117.

In this embodiment, image reconstruction by the parallel MRI method is performed on the respective k-spaces corresponding to the angles of rotation of the blades 301 through 304 without performing the gridding processing. Hence, in comparison with the method in the related art by which the aliasing artifacts are developed using an generalized algorithm with respect to the k-space after the gridding processing, a quantity of calculation is reduced markedly, because the need for the generalized algorithm is eliminated by developing the aliasing artifacts in the respective k-spaces before the gridding processing, and because interpolation is not necessary for the reconstruction by the parallel MRI method.

Figure 2:
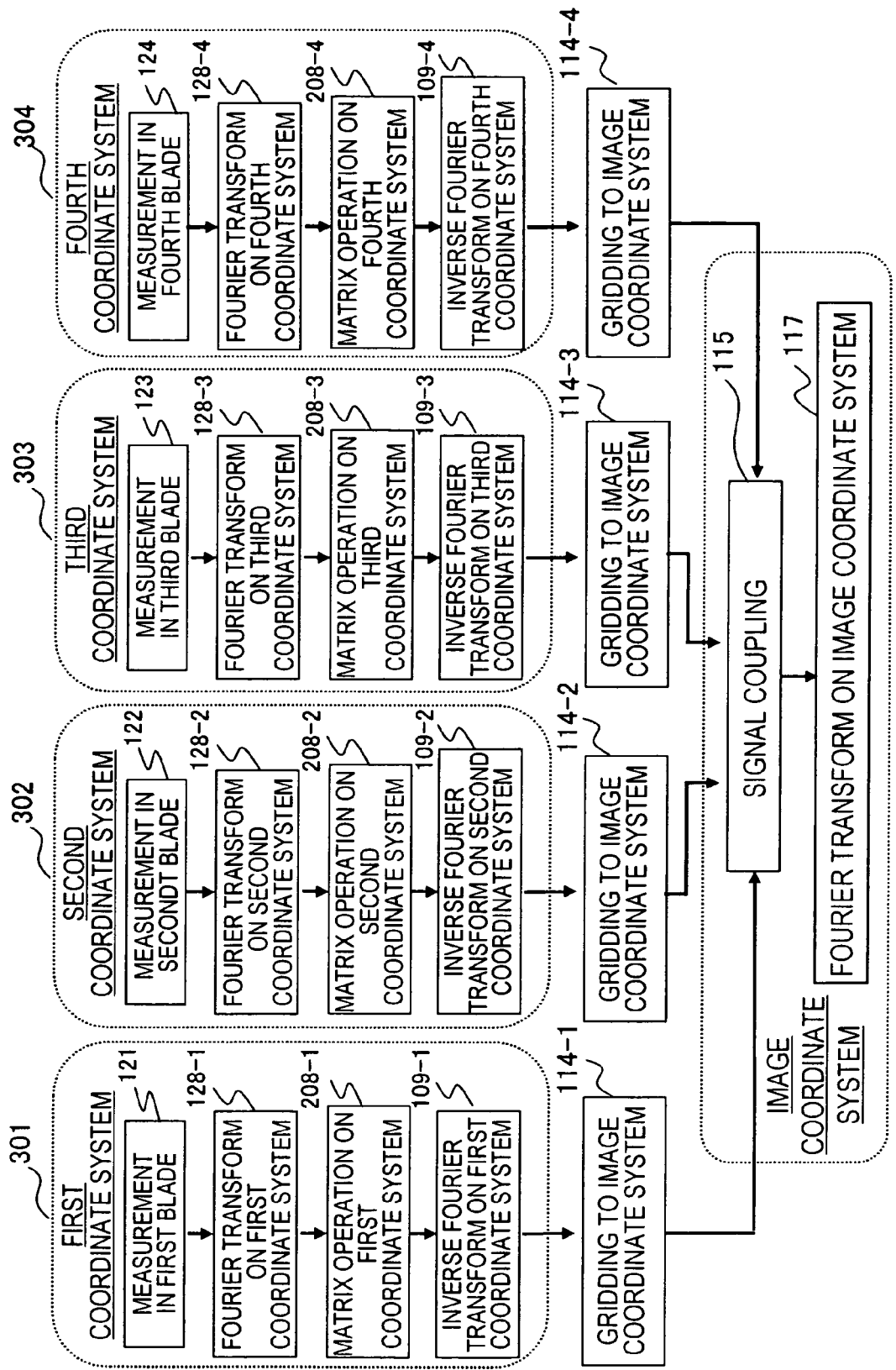
FIG. 2 is a view schematically showing a signal processing flow in the first embodiment of the invention.

When the invention is described in terms of processing, it is as shown in FIG. 2. Aliasing images are formed by subjecting echo signal data acquired by measurements 121 through 124 in the respective blades 301 through 304 to Fourier transforms 128-1 through 128-4 on the respective coordinate systems, after which images having no aliasing artifacts are obtained by performing aliasing artifact removals 208-1 through 208-4 by the parallel MRI method on the respective coordinate systems. The resultant images are subjected to inverse Fourier transforms 109-1 through 109-4 to obtain k-space data on the respective coordinate systems. For the final image, the k-space data generated on the respective coordinate systems is subjected to the gridding processing 114-1 through 114-4 on the image coordinate system, after which final k-space data on the image coordinate system is synthesized through the signal coupling processing 115 followed by Fourier transform 117.

Each processing in the first embodiment of the invention, for example, the Fourier transform 128, the matrix operation 208, the inverse Fourier transform 109, and the gridding processing 114 in the MRI apparatus shown in FIG. 4, is performed by the CPU 8, and the sensitivity distribution data and the image data of each blade are stored, for example, in the magnetic disc 18, which are read into the internal memory of the CPU 8 and processed as needed. The same applies in other embodiments below.

Second Embodiment

Figure 8A:
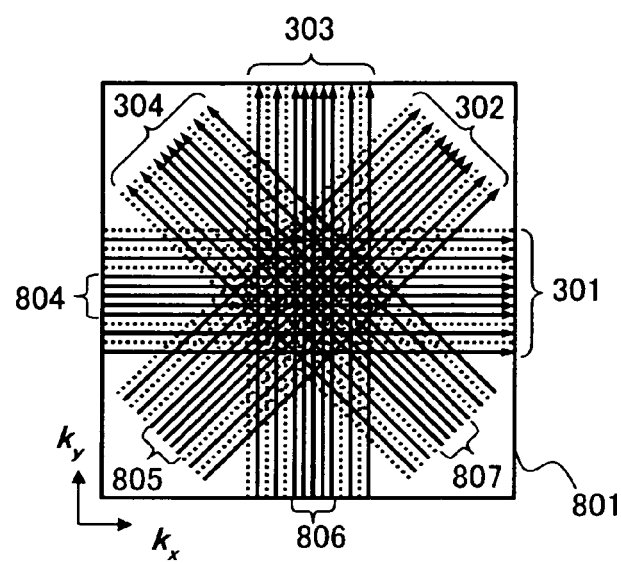
FIG. 8 is a view showing a case where echo signals for sensitivity distribution data are measured excessively by measuring low spatial frequency regions of the k-space densely in a second embodiment of the invention, FIG. 8a being a view showing data mapping on a k-space when low spatial frequency regions are measured densely in respective blades, FIG. 8b being a view when data of low spatial frequency regions alone is extracted from FIG. 8a to find sensitivity distribution data, and FIG. 8c being a view when data skipped at certain intervals alone is extracted from FIG. 8a to find aliasing images.

A second embodiment of the invention will now be described with reference to FIG. 8. For simplicity of description, the PROPELLER MRI method in a case where the number of blades is four will be described. In this embodiment, echo signals are acquired as are shown in FIG. 8a (solid lines represent echo signals that will be measured, and dotted lines represent trajectories of echo signals that will not be measured). A difference from FIG. 3b is the number of and intervals between parallel trajectories within each blade in a k-space 801. In other words, k-spaces within the respective blades 301 through 304 are divided to low spatial frequency regions 804 through 807 and high spatial frequency regions on the outside, and phase encoding steps when acquiring echo signals in the low spatial frequency regions are made smaller (that is, denser) than phase encoding steps in the high spatial frequency regions. Conversely, phase encoding steps when acquiring echo signals in the high spatial frequency regions may be made larger (that is, coarser) than phase encoding steps in the low spatial frequency regions. FIG. 8a shows a case where measurements are performed by making acquisition intervals of echo signals in the low spatial frequency regions twice as dense as acquisition intervals of echo signals in the high spatial frequency regions.

Echo signals of FIG. 8a are divided to two groups of echo signals for ease of description.

Figure 8B:
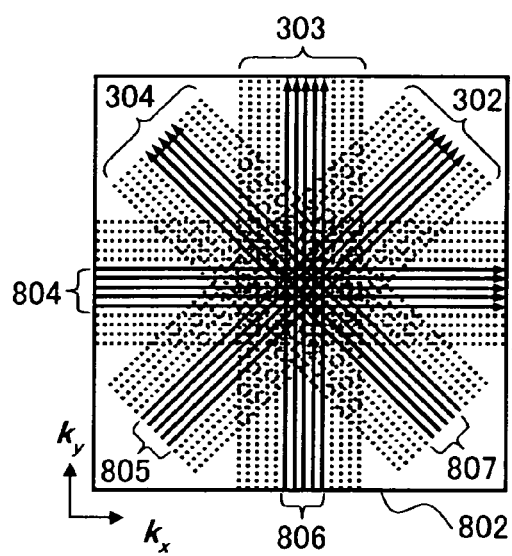

(1) FIG. 8b shows a case where data of echo signals acquired within the low spatial frequency regions 804 through 807 alone are selected.

Figure 8C:
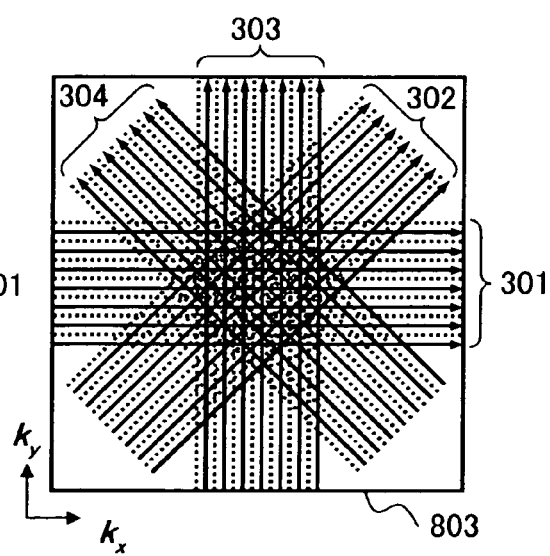

(2) FIG. 8c shows a case where, of echo signals within the blade, data of echo signals acquired in steps of every other line are selected.

Because FIG. 8b shows data sets in the low spatial frequency regions, it is possible to calculate sensitivity distribution data 101 through 104 of the RF receiver coils needed for reconstruction by the parallel MRI method within the respective blades 301 through 304 from these data sets. In addition, because FIG. 8c shows data sets equivalent to those of FIG. 3c, it is possible to reconstruct aliasing images 355 through 358 for the respective blades 301 through 304 from these data sets. A final image can be obtained by performing the same processing as FIG. 1 using both the sensitivity distribution data 101 through 104 and the aliasing images 355 through 358 of the respective blades obtained as has been described.

Advantages of this embodiment are that the sensitivity distribution data of the RF receiver coils needed for the parallel MRI method can be acquired simultaneously with imaging (real measurements) to obtain an image. In comparison with a case where the sensitivity distribution data is acquired using an exclusive pulse sequence, an error between the sensitivity distribution data and the real measurement data is small even when the position of the subject is changed during imaging, and aliasing artifacts can be therefore developed in a stable manner. In the case of imaging a heart region or other regions where motions of the subject are large, this embodiment can be applied to a technique (interactive scan method) for performing imaging while changing imaging planes in real time.

An angle of rotation of the k-space varies from blade to blade in the PROPELLER MRI method; however, as has been described, rotations of the k-space correspond to rotations of an image space (a space representing the image data, a projected image of the k-space by Fourier transform). Hence, the coordinate system may be transformed by rotating the sensitivity distribution data obtained in a given blade on the image space by interpolation processing, so that the resultant data can be used in the aliasing artifact removing processing on the coordinate systems of the other blades. This can be described as follows by using FIG. 1 as an example. That is, only the sensitivity distribution data 101 of the first coordinate system with respect to the blade 301 has been measured, and the measurements to acquire the sensitivity distribution data are not performed for the remaining blades 302 through 304. Rotation processing is thus performed through interpolation using the first sensitivity distribution data 101 to generate the sensitivity distribution data 102 through 104 of the respective blades. When processed in this manner, the number of blades that are measured to acquire the sensitivity distribution data is reduced, which can in turn shorten a time needed for the entire imaging.

Alternatively, in a case where echo signals for sensitivity distribution data are acquired in plural blades, the acquired echo signals for sensitivity distribution data are first transformed to (re-mapped on) the image coordinate system by gridding processing and then subjected to Fourier transform after signal coupling for the sensitivity distribution data to be generated. The sensitivity distribution data is transformed back to the coordinate systems corresponding to the respective blades by rotation processing. The resultant data can be used in the aliasing artifact removing processing in the parallel MRI method. In this case, because echo signals for the sensitivity distribution data are added up, an S/N ratio of the sensitivity distribution data is enhanced. In the parallel MRI method, an S/N ratio of the sensitivity distribution data used to develop the aliasing artifacts is known to give significant influences to an S/N ratio of the resultant image, and enhancement of an S/N ratio of the sensitivity distribution data is therefore useful.

The method of finding the sensitivity distribution data of each blade with the use of echo signals for sensitivity distribution data acquired in plural blades may have variations as follows. One variation is a method by which the acquired echo signals for sensitivity distribution data are first transformed to the image coordinate system by gridding processing, and then transformed back to coordinate systems corresponding to the respective blades by rotation processing after signal coupling, and the sensitivity distribution data is generated by subjecting the resultant data to Fourier transform on the coordinate systems corresponding to the respective blades. Another variation is a method by which sensitivity distribution data is generated by subjecting the acquired echo signals for sensitivity distribution data to Fourier transform on the coordinate systems corresponding to the respective blades, and the sensitivity distribution data is first transformed to the image coordinate system by gridding processing to be synthesized (by addition or averaging), after which the resultant data is transformed back to the coordinate systems corresponding to the respective blades by rotation processing.

In any of the methods described above, processing in each step is performed for each RF receiver coil, and the final sensitivity distribution data is found for each blade and for each RF receiver coil, that is, the sensitivity distribution data of each RF receiver coil on the coordinate system corresponding to each blade is found.

Further, in the PROPELLER MRI method, echo signals in the low spatial frequency region of the k-space are obtained for each blade, and an angle of rotation differs from blade to blade. It is thus possible to acquire echo signals densely in the low spatial frequency region of the k-space even when skipped-measurements are performed as in FIG. 8c. Hence, of the echo signals acquired in the respective blades, data of the low spatial frequency regions alone is extracted and transformed first to the image coordinate system by gridding processing to be synthesized, and the sensitivity distribution data can be then generated using the data of the low spatial frequency regions thus synthesized. In this case, too, reconstruction by the parallel MRI method is enabled using only the pulse sequence for acquiring image echo signals, without using an exclusive pulse sequence for obtaining sensitivity distribution data, or a sequence for measuring echo signals for sensitivity distribution data excessively by measuring the low spatial frequency regions densely as described above. It is thus possible to obtain, at high speeds, blade images and an entire image from which aliasing artifacts are removed.

In a case where extracting and synthesizing echo signals in the low spatial frequency regions in the respective blades is insufficient to find the sensitivity distribution data, by measuring echo signals densely in the low spatial frequency region alone in one or more than one blade as needed in the manner as described above, echo signals for sensitivity distribution data can be acquired at a sufficiently high density to find the sensitivity distribution data.

The method of finding the sensitivity distribution data using the data of the low spatial frequency regions may have the same variations as those of the method of finding the sensitivity distribution data from echo signals for sensitivity distribution data as described above. Further, it is also the same that the finally found sensitivity distribution data is the sensitivity distribution data of each RF receiver coil on the coordinate system corresponding to each blade.

The block in which each processing is performed in the MRI apparatus shown in FIG. 4 in the second embodiment of the invention as described above is the same as in the first embodiment. However, besides the foregoing processing, the processing to find the sensitivity distribution data is also performed by the CPU 8, and echo signals for sensitivity distribution data in each blade are stored, for example, in the magnetic disc 18, and read into the internal memory of the CPU 8 to be processed as needed.

Third Embodiment

A third embodiment of the invention will now be described with reference to FIGS. 9 and 10. Because the reconstruction processing in the parallel MRI method is independent for each blade according to the method of the invention, image reconstruction processing for a given blade can be started at a time point at which echo signal data within this blade has been obtained, which enables faster imaging.

For simplicity of description, the PROPELLER MRI method in a case where measurements are performed using four blades will be described. FIGS. 9 and 10 show cases where the invention is applied to continuous imaging using the PROPELLER MRI method comprising four blades 301 through 304, and the horizontal direction indicates a time course.

Figure 9:
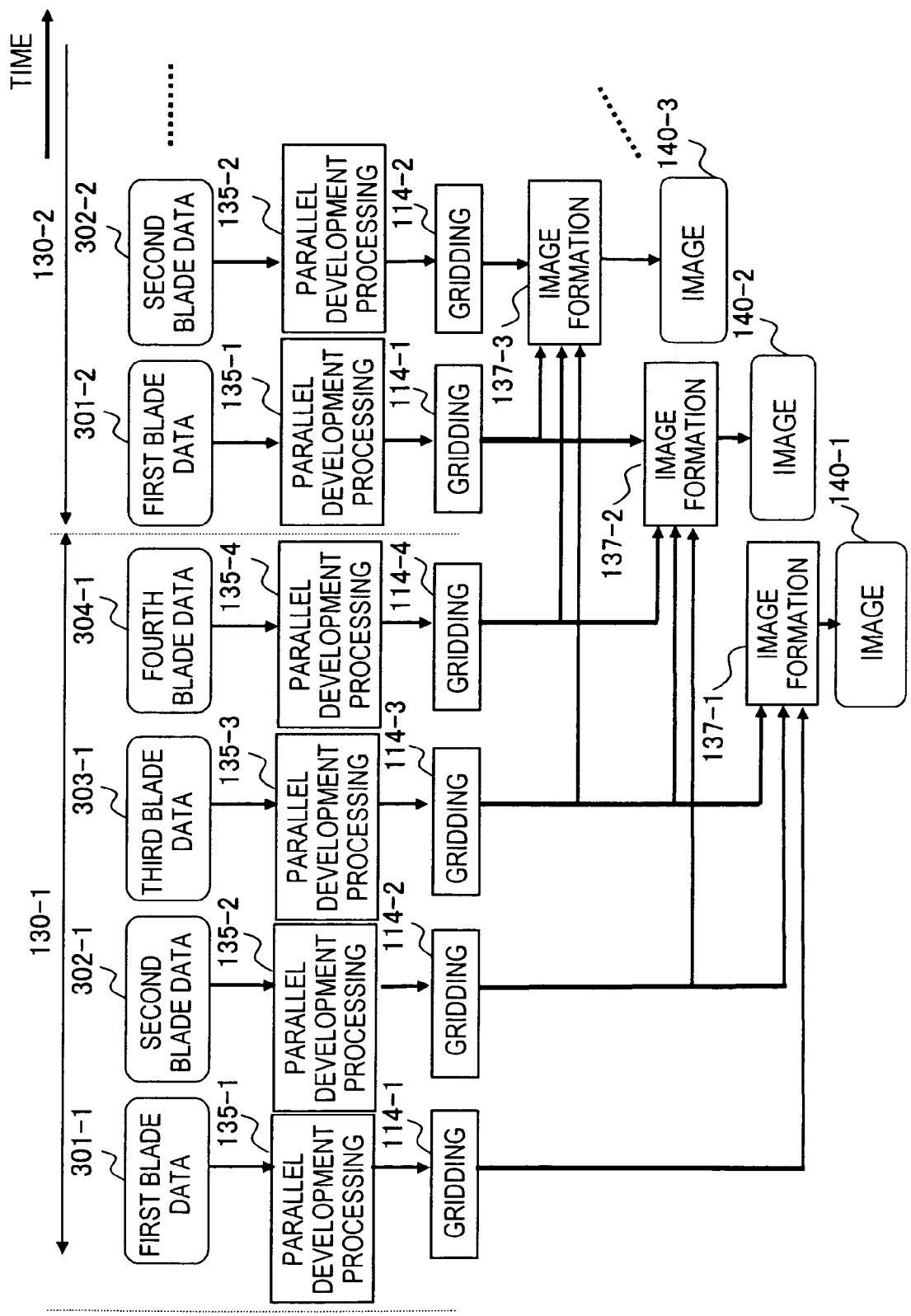
FIG. 9 is a view showing signal processing when continuous imaging is performed in a third embodiment of the invention.

FIG. 9 shows an example of a method of enhancing time resolution of each image by forming an image for each blade. As is shown in FIG. 9, because processing is performed for each of the blades 301 through 304, parallel development processing 135 (128, 208, and 109 are performed as internal processing) and the gridding processing 114 can be started immediately after the measurements 301-1 through 304-1 of the respective blades 301 through 304 end. In the PROPELLER MRI method, because data labeled with the same blade number is measured in such a manner that an angle of rotation of the k-space is equal or almost equal, an image at the intermediate time phase of an image updating interval 130 can be formed by performing image formation 137 (115 and 117 are performed as internal processing) by sorting out k-space data created in the gridding processing 114. When images are obtained continuously in this manner, it is possible to enhance time resolution of these images.

For example, an image 140-1 is obtained by selecting data of the blades 301-1, 302-1, 303-1, and 304-1 and performing image formation 137-1. Then, by performing image formation 137-2 using data of 302-1, 303-1, 304-1, and 301-2, in which the data of the first blade alone is updated, an image 140-2 can be obtained, which has a delay in time phase comparable to the measurement of the blade 301-2 with respect to the image 1401-1. Likewise, by performing image formation 137-3 using data of 303-1, 304-1, 301-2, and 302-2, an image 140-3 can be obtained, which has a delay in time phase comparable to the measurement of the blade 302-2 with respect to the image 140-2. In this manner, it is possible to shorten image updating time intervals.

On the contrary, in the method in the related art, generalized parallel development is necessary by performing the gridding processing after echo signals in all the blades are acquired, and this allows an image to be obtained, for example, only at the time interval 130.

Figure 10:
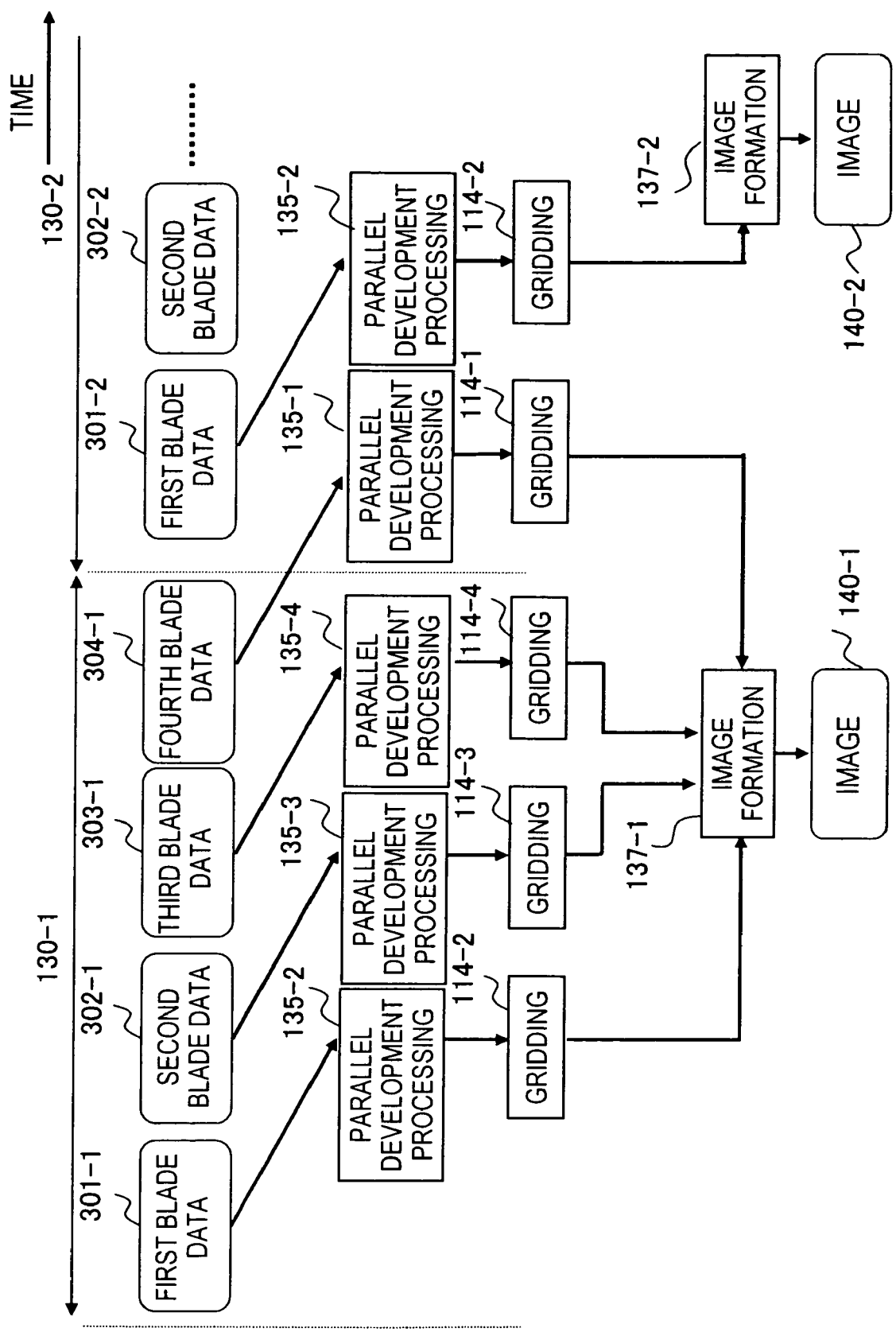
FIG. 10 is a view showing signal processing when parallel processing is performed in the third embodiment of the invention.

Also, FIG. 10 shows an example of a method of shortening the overall processing time by performing measurements of echo signals within the blades and the following image reconstruction processing in parallel. As is shown in FIG. 10, when the respective blades 301 through 304 are measured, the parallel development processing 135 (128, 208, and 109 are performed as internal processing) and the gridding processing 114 are performed using data acquired when the blades were measured earlier. For example, measurements of the respective blades 301 through 304 are performed under the control of the sequencer 4, and simultaneously, the parallel development processing 135 and the gridding processing 114 are performed by the CPU 8, which enables each processing to be performed independently in parallel. An image 140 is thus obtained by performing image formation 137 (115 and 117 are performed as internal processing) using the k-space data of the respective blades when the gridding processing 114 ends for all the blades 301 through 304. FIG. 10 shows a case where an image 140-1 in the immediately preceding cycle is obtained when the measurement and the image reconstruction processing of the first blade 301-2 in the following cycle have ended. Fast imaging is thus enabled by shortening a time needed to obtain a single image.

On the contrary, in the method in the related art, generalized parallel development is necessary by performing the gridding processing after echo signals in all the blades are acquired, which extends a time from the measurement is started until an image is obtained.

The two fast imaging methods described above can be performed either solely or in combination.

The concrete embodiments of the invention, in which the parallel MRI method is applied to the PROPELLER MRI method, have been described.

It should be appreciated, however, that the invention is not limited to the contents disclosed in the descriptions of the embodiments above, and can be modified in various manners within the scope of the invention.

For example, the respective embodiments above have been described using a gradient echo pulse sequence. However, the PROPELLER MRI method is independent of the kinds of pulse sequence, and can be applied to an SE pulse sequence, an FSE pulse sequence, and an EPI pulse sequence.

Also, as the embodiments of the PROPELLER MRI method, a case where the k-space is rotated within a two-dimensional plane comprising the X-axis and the Y-axis has been described. However, the slicing axis, the phase encoding axis, and the frequency encoding axis can correspond arbitrarily to the axes, X, Y, and Z, of an imaging space, and oblique imaging and off-center imaging can be performed as well. Further, rotations within a three-dimensional sphere are also possible.

Also, the PROPELLER MRI method in a case where the number of the blades is four has been described. However, in actual imaging, the number of blades and the number of echoes within each blade can be set arbitrarily, and the same processing can be performed in this case, too.

Also, the parallel MRI method in a case where the number of the RF receiver coil is two and the phase encoding interval is doubled has been described. However, the number of the RF receiver coils and the magnification of the phase encoding intervals can be set arbitrarily (note, however, that the number of RF receiver coils≧magnification of phase encoding intervals). In addition, signals acquired at the RE receiver coils can be selected and synthesized to match with a plane being imaged.

An imaging time can be shortened further by omitting measurements of echo signals in the high spatial frequency regions on one side of the blades and applying instead a known half Fourier method (reference: JP-A-7-31605) to form blade images. For example, the high spatial frequency regions on one side, for which measurements of the echo signals are omitted, can be interpolated by placing conjugates of measured echo signals in the high spatial frequency regions on the other side to be symmetric with respect to the origin of the k-space.

Also, the embodiments above have described the parallel MRI method for developing aliasing artifacts in an image space. However, the invention is also applicable to the parallel MRI method for creating echo signals that are skipped in the k-space.

Further, in the invention, measurements of echo signals can be skipped within a range allowed by the PROPELLER MRI method without applying the parallel MRI method. In general, blurring, aliasing artifacts and the like occur in blade images and the entire image in proportion to a quantity of skipped measurements of echo signals. However, these problems occur in different manners depending on the skipping positions on the k-space. For example, skipping in the high spatial frequency regions of the k-space gives small influence to the image in comparison with skipping in the low spatial frequency regions. Also, by making the field of view larger than the imaging plane, it is possible to prevent the occurrence of aliasing artifacts substantially to some extent.

It is therefore possible to obtain an image having substantially no problem without applying the parallel MRI method, by adjusting the positions or the range at or within which measurements of echo signals are skipped on the k-space depending on the field of view or resolution of an image. This can shorten the measuring time of the blade in the PROPELLER sampling method, which in turn enables fast imaging by shortening the overall imaging time.

Further, it is sufficient to obtain blade images by merely fusing images for each of the RF receiver coils that together constitute the multiple receiver coil, while measurements of echo signals are skipped to the extent that an image having substantially no problem can be obtained as described above. This not only enables fast imaging by shortening an imaging time, but also enhances S/N ratios of blade images and the entire image.

Alternatively, it is possible to shorten an imaging time without applying the parallel MRI method and by forming instead blade images in accordance with computation according to a known half Fourier method by omitting measurements of echo signals in the high spatial frequency regions on one side of the blades as has been described.

As has been described, according to the invention, by applying the parallel MRI method to the PROPELLER MRI method, an imaging time can be shortened without causing aliasing artifacts even when the number of echoes to be acquired within one blade is reduced. Also, because the need to apply the generalized algorithm for removing the aliasing artifacts, which is necessary when applying the parallel MRI method, and the need to perform the gridding processing, which is necessary for the PROPELLER MRI method, are both eliminated, a computation volume can be reduced and fast computation is thereby achieved, which enables fast imaging as a whole.

In addition, it is possible to substantially shorten an imaging time needed for the PROPELLER MRI method without applying the parallel MRI method, by skipping measurements of echo signals within a range allowed by the PROPELLER MRI method alone.

The invention claimed is:

1. A magnetic resonance imaging method, comprising:
   a unit region measuring step of measuring echo signals from a subject corresponding to a unit region having an origin of a k-space and a specific width from a low spatial frequency region to a high spatial frequency region, and
   a unit region image forming step of forming an image of the unit region from echo signals corresponding to the unit region, while changing an angle of rotation of the unit region about the origin of the k-space, so that an entire image is formed by fusing plural unit region images,
   the magnetic resonance imaging method being characterized in that, in the unit region measuring step, measurements of the echo signals are skipped in at least one unit region.

2. The magnetic resonance imaging method according to claim 1, characterized in that:
   in the unit region measuring step, a multiple receiver coil formed by combining plural receiver coil units is used to acquire echo signals at each receiver coin unit; and
   in the unit region image forming step, the unit region image is formed using the echo signals at each receiver coil unit.

3. The magnetic resonance imaging method according to claim 2, characterized in that:
   in the unit region image forming step, the unit region image from which aliasing artifacts are removed is formed by using sensitivity distribution data of each receiver coil unit.

4. The magnetic resonance imaging method according to claim 3, characterized in that:
   the unit region comprises plural parallel trajectories; and
   a measurement of echo signals corresponding to at least one trajectory among the parallel trajectories is skipped in the skipped measurements.

5. The magnetic resonance imaging method according to claim 4, further comprising:
   a sensitivity distribution data generating step of generating sensitivity distribution data of each unit region and each receiver coil unit from the echo signals to correspond to the angle of rotation of the unit region and a configuration of the multiple receiver coil; and
   the sensitivity distribution data generating step is performed before the unit region image forming step.

6. The magnetic resonance imaging method according to claim 5, characterized in that:
   in the sensitivity distribution data generating step, the sensitivity distribution data of each unit region and each receiver coil unit is generated independently, using the echo signals at each receiver coil unit in low spatial frequency regions of plural unit regions.

7. The magnetic resonance imaging method according to claim 6, characterized in that;
   in the sensitivity distribution data generating step, echo signals for sensitivity distribution data for each receiver coil unit is generated by synthesizing echo signals at each receiver coil unit in the low spatial frequency regions of the respective unit regions for each receiving coil unit, echo signals for sensitivity distribution data for each unit region and each receiver coil unit is generated independently by converting the echo signals for sensitive distribution data for each receiver coil unit, and sensitivity distribution data of each unit region and each receiver coil unit is generated independently from the thus-generated respective echo signals for sensitivity distribution data for each unit region and receiver coil unit.

8. The magnetic resonance imaging method according to claim 7, characterized in that:
   the unit region measuring step and the unit region image forming step are performed in parallel;
   in the unit region image forming step, the unit region image is formed using echo signals measured in a unit region measuring step before the current unit region measuring step;
   after all unit region images including the unit region image are collected, k-space data of each unit region is generated by subjecting all the unit region images to inverse Fourier transform, entire k-space data is generated by synthesizing the k-space data of each unit region, and the entire image is formed by subjecting the entire k-space data to Fourier transform; and
   the k-space data of each unit region is synthesized by converting the k-space data of each unit region to grid point data on a same coordinate system, and each converted k-space data is added or averaged for each grid point.

9. The magnetic resonance imaging method according to claim 6, characterized in that:
   in the sensitivity distribution data generating step, sensitivity distribution data of each unit region and each receiver coil unit is generated independently from echo signals at each receiver coil unit in the low spatial frequency regions in the respective unit regions, sensitivity distribution data of each receiver coil unit is generated by synthesizing the sensitivity distribution data of each unit region and each receiver coil for each receiver coil unit, and sensitivity distribution data of each unit region and each receiver coil unit is generated by converting the sensitivity distribution data of each receiver coil unit.

10. The magnetic resonance imaging method according to claim 6, characterized in that:
    in the sensitivity distribution data generating step, echo signals for sensitivity distribution data for each receiver coil unit are generated by synthesizing echo signals at each receiver coil unit in the low spatial frequency regions in the respective unit regions for each receiver coil unit, sensitivity distribution data of each receiver coil unit is generated from the echo signals for sensitivity distribution data for each receiver coil unit, and sensitivity distribution data of each unit region and each receiver coil unit is generated by converting the sensitivity distribution data of each receiver coil unit.

11. The magnetic resonance imaging method according to claim 5, characterized in that;
in the unit region measuring step, the echo signals at each receiver coil unit are measured by making intervals between the plural parallel trajectories denser in the low spatial frequency region than intervals in the high spatial frequency region in each of the plural unit regions; and
in the sensitivity distribution data generating step, the sensitivity distribution data of each unit region and each receiver coil is generated independently, using the echo signals at each receiver coil unit in the low spatial frequency regions measured densely in the plural unit regions.

12. The magnetic resonance imaging method according to claim 11, characterized in that:
in the sensitivity distribution data generating step, echo signals for sensitivity distribution data for each receiver coil unit is generated by synthesizing echo signals at each receiver coil unit in the low spatial frequency regions of the respective unit regions for each receiving coil unit, echo signals for sensitivity distribution data for each unit region and each receiver coil unit is generated independently by converting the echo signals for sensitive distribution data for each receiver coil unit, and sensitivity distribution data of each unit region and each receiver coil unit is generated independently from the thus-generated respective echo signals for sensitivity distribution data for each unit region and receiver coil unit.

13. The magnetic resonance imaging method according to claim 11, characterized in that: in the sensitivity distribution data generating step, sensitivity distribution data of each unit region and each receiver coil unit is generated independently from echo signals at each receiver coil unit in the low spatial frequency regions in the respective unit regions, sensitivity distribution data of each receiver coil unit is generated by synthesizing the sensitivity distribution data of each unit region and each receiver coil for each receiver coil unit, and sensitivity distribution data of each unit region and each receiver coil unit is generated by converting the sensitivity distribution data of each receiver coil unit.

14. The magnetic resonance imaging method according to claim 11, characterized in that:
in the sensitivity distribution data generating step, echo signals for sensitivity distribution data for each receiver coil unit are generated by synthesizing echo signals at each receiver coil unit in the low spatial frequency regions in the respective unit regions for each receiver coil unit, sensitivity distribution data of each receiver coil unit is generated from the echo signals for sensitivity distribution data for each receiver coil unit, and sensitivity distribution data of each unit region and each receiver coil unit is generated by converting the sensitivity distribution data of each receiver coil unit.

15. The magnetic resonance imaging method according to claim 5, characterized in that:
in the unit region measuring step, the echo signals at each receiver coil unit are measured by making intervals of the plural parallel trajectories in the low spatial frequency region denser than intervals in the high spatial frequency region in one of the unit regions; and in the sensitivity distribution data generating step, for another unit region, sensitivity distribution data of each unit region and each receiver coil is generated using the echo signals at receiver coil unit in the low spatial frequency region measured densely in the particular one of the unit regions.

16. The magnetic resonance imaging method according to claim 5, characterized in that the method comprises:
a step of measuring echo signals for sensitivity-distribution data for each receiver coil unit in advance,
wherein, in the sensitivity distribution data generating step, sensitivity distribution data of each unit region and each receiver coil unit is generated using the echo signals for sensitivity distribution data for each receiver coil unit that has been measured in advance.

17. The magnetic resonance imaging methods according to claim 1, characterized in that;
measurements of echo signals corresponding to the high spatial frequency region on one side of the unit region are skipped.

18. The magnetic resonance imaging method according to claim 1, characterized in that, each time the unit region measuring step ends:
in the unit region image fanning step, a unit region image is formed; and the entire image is formed from the unit region image and at least another one unit region image formed through one or more other iterations of said unit region measuring step and said unit region image forming step.

19. The magnetic resonance imaging method according to claim 1, characterized in that:
the unit region measuring step and the unit region image forming step are performed in parallel;
in the unit region image forming step, the unit region image is formed using echo signals measured in a unit region measuring step before the current unit region measuring step; and
the entire image is formed from the unit region image and at least another one unit region image formed though one or more other iterations of said unit region measuring step and said unit region image forming step.

20. A magnetic resonance imaging apparatus, comprising signal receiving means for receiving echo signals from a subject;
measurement control means for measuring the echo signals according to a specific sequence;
signal processing means for performing image reconstruction computation using the echo signals; and
overall control means for controlling the measurement control means and the signal processing means,
the measurement control means being provided with a sequence, according to which a measurement of echo signals corresponding to a unit region fanned of plural parallel trajectories on a k-space is repeated by changing an angle of rotation of the unit region about an origin of the k-space,
the signal processing means including unit region image fanning means for forming a unit region image from echo signals for each unit region, and entire image forming means for forming an entire image from respective unit region images,
wherein the magnetic resonance imaging apparatus is characterized in that:
the signal receiving means includes a multiple receiver coil formed by combining plural receiver coil units to receive the echo signals at each receiver coil unit;

the measurement control means measures the echo signals at each receiver coil unit by skipping one or more parallel trajectories in one or more unit regions; and the unit region image forming means forms the unit region image from which aliasing artefacts are removed, by utilizing the echo signals at each receiver coil unit measured by said measurement control means and utilizing sensitivity distribution data of each unit region and each receiver coil unit.

21. The magnetic resonance imaging apparatus according to claim 20, characterized in that:

the signal processing means further includes sensitivity distribution data generating means for generating sensitivity distribution data of each unit region and each receiver coil unit from the echo signals to correspond to the angle of rotation and a configuration of the multiple receiver coil.

22. The magnetic resonance imaging apparatus according to claim 21, characterized in that:

the overall control means repeats, for each unit region, a measurement of echo signals corresponding to the unit region by the measurement control means, formation of the unit region image using the echo signals by the unit region image forming means, and formation of the entire image from the unit region image and another unit region image by the entire image forming means.

23. The magnetic resonance imaging apparatus according to claim 21, characterized in that:

the overall control means repeats, in parallel, a measurement of echo signals corresponding to the unit region by the measurement control means, and the unit region image formation using echo signals acquired by a measurement of a unit region before the measurement of the current unit region by the unit region image forming means, and formation of the entire image in the entire image forming means each time the unit region image and at least another one region image are collected.

24. A magnetic resonance imaging method comprising:

a unit region measuring step of measuring echo signals from a subject corresponding to a unit region having plural parallel trajectories on a k-space using a multiple receiver coil formed by combining plural receiver coil units;

a unit region image forming step of forming an image of the unit region from echo signal data corresponding to the unit region;

a step of repeating both of said unit region measuring step and said unit region image forming step by changing an angle of rotation of the unit region about the origin of the k-space; and an entire image forming step forming an entire image from plural unit region images, wherein a sensitivity distribution data generating step is further included for generating sensitivity distribution data of each receiver coil unit from the echo signal data of respective receiver coil units, in said unit region measuring step, measurements of one or more echo signals are skipped in at least one unit region, in said unit region image forming step, the image of the unit region is formed from both of the echo signal data of the unit region and the sensitivity distribution data of each receiver coil unit, in said sensitivity distribution data generating step, the sensitivity distribution data of each receiver coil unit is generated from the echo signal data of the low special frequency regions of plural unit regions.

25. The magnetic resonance imaging method of claim 24, wherein at least one echo signal of each unit region is skipped from the measurements of said unit region measuring step.

26. The magnetic resonance imaging method of claim 24, wherein each unit region image is transformed into k-space data by inverse Fourier transform, the k-space data are synthesized into entire k-space darn, and the entire k-space data is transformed into the entire image by Fourier transform.

27. The magnetic resonance imaging apparatus of claim 24, wherein at least one echo signal of each unit region is skipped from the measurements of said unit region measuring step.

28. The magnetic resonance imaging apparatus of claim 24, wherein each unit region image is transformed into k-space data by inverse Fourier transform, the k-space data are synthesized into entire k-space data, and the entire k-space data is transformed into the entire image by Fourier transform.

29. A magnetic resonance imaging apparatus comprising:

signal receiving means for receiving echo signals from a subject;

measurement control means for measuring the echo signals according to a specific sequence;

signal processing means for performing image reconstruction computation using the echo signals; and overall control means for controlling the measurement control means and the signal processing means, wherein the measurement control means is provided with a sequence, according to which a measurement of echo signals corresponding to a unit region formed of plural parallel trajectories on a k-space is repeated by changing an angle of rotation of the unit region about an origin of the k-space, wherein the signal processing means includes unit region image forming means for forming a unit region image from echo signals for each unit region, anti entire image forming means for forming an entire image from respective unit region images, wherein the signal receiving means includes a multiple receiver coil formed by combining plural receiver coil units to receive the echo signals at each receiver coil unit;

wherein the measurement control means measures the echo signals at each receiver coil unit by skipping one or more parallel trajectories in one or more unit regions;

wherein the unit region image forming means forms the unit region image from which aliasing is removed, from both of the echo signals data at each receiver coil unit measured by skipping one or more parallel trajectories in one or more unit regions and sensitivity distribution data of each unit region and each receiver coil unit; and wherein the sensitivity distribution data of each receiver coil unit is generated from the echo signal data of the low special frequency regions of plural unit regions.

* * * * *